United States Patent [19]
Motoda et al.

[11] Patent Number: 5,604,764
[45] Date of Patent: Feb. 18, 1997

[54] SEMICONDUCTOR LASER

[75] Inventors: Takashi Motoda; Manabu Kato, both of Itami, Japan

[73] Assignee: Mitsubishi Denki Kabushiki Kaisha, Tokyo, Japan

[21] Appl. No.: 611,089

[22] Filed: Mar. 5, 1996

Related U.S. Application Data

[62] Division of Ser. No. 399,649, Mar. 7, 1995.

[30] Foreign Application Priority Data

Jul. 25, 1994 [JP] Japan ................................. 6-172553

[51] Int. Cl.⁶ ........................................... H01S 3/19
[52] U.S. Cl. ................................. 372/46; 372/45
[58] Field of Search .................................. 372/45, 46

[56] References Cited

U.S. PATENT DOCUMENTS

| | | | |
|---|---|---|---|
| 4,946,802 | 8/1990 | Shima et al. | 437/129 |
| 5,383,215 | 1/1995 | Narui et al. | 372/46 |
| 5,426,658 | 6/1995 | Koneno et al. | 372/46 |

FOREIGN PATENT DOCUMENTS

| | | |
|---|---|---|
| 0026062 | 9/1981 | European Pat. Off. . |
| 0433051 | 6/1991 | European Pat. Off. . |
| 58-114477 | 7/1983 | Japan . |
| 59-210681 | 11/1984 | Japan . |
| 3283693 | 12/1991 | Japan . |
| 448669 | 2/1992 | Japan . |
| 443690 | 2/1992 | Japan . |

*Primary Examiner*—James W. Davie
*Attorney, Agent, or Firm*—Leydig, Voit & Mayer

[57] ABSTRACT

A method of fabricating a semiconductor laser includes forming a mask having a stripe opening in a <011> direction on a {100} surface of a first conductivity type substrate, and growing a double-heterojunction structure including a first conductivity type cladding layer, an active layer, and a second conductivity type cladding layer on the {100} surface using the mask, thereby producing a stripe-shaped ridge in which the active layer and the first conductivity type lower cladding layer are covered with the second conductivity type upper cladding layer. The stripe-shaped ridge has an ordinary mesa-shaped cross-section in a direction perpendicular to the stripe direction and a symmetrical hexagonal cross-section in the stripe direction. In this method, since the conventional selective etching for forming the ridge is dispensed with, the processing precision of the ridge is improved. Further, the second conductivity type cladding layer and the active layer grown on the side surfaces of the first conductivity type cladding layer are very thin and have low dopant incorporating efficiencies, so that portions of the first conductivity type cladding layer grown at the side surfaces of the ridge have high resistivity, and reactive current is blocked by these high-resistance portions.

16 Claims, 16 Drawing Sheets

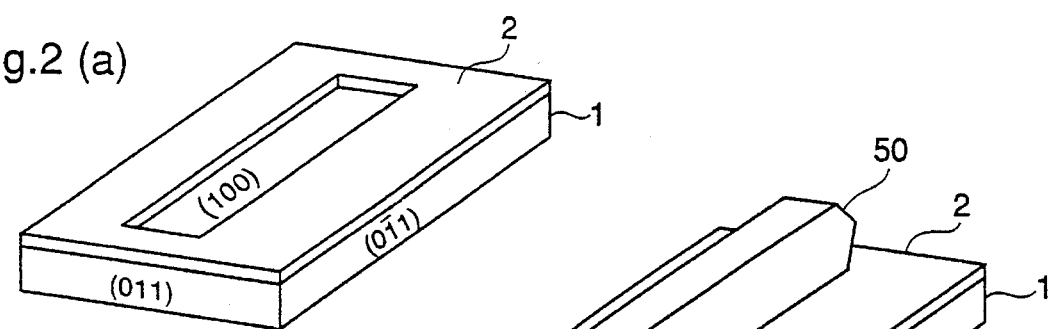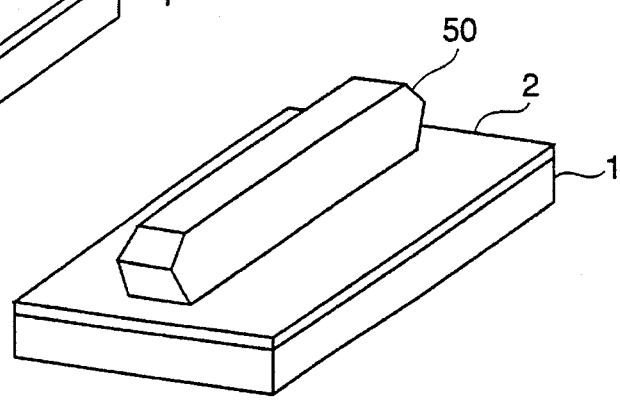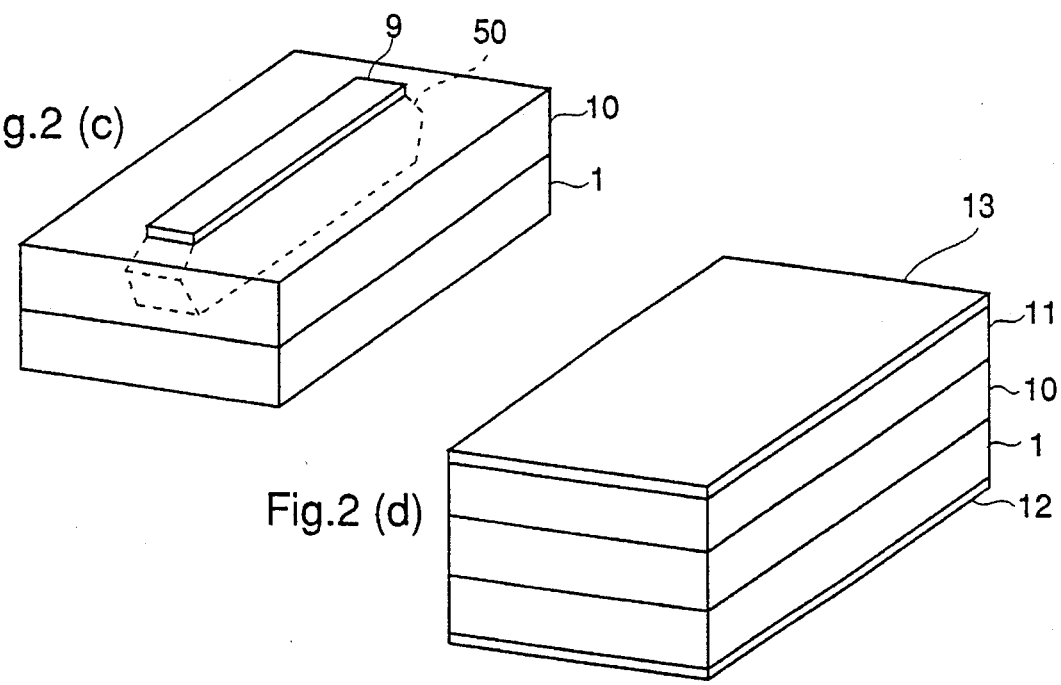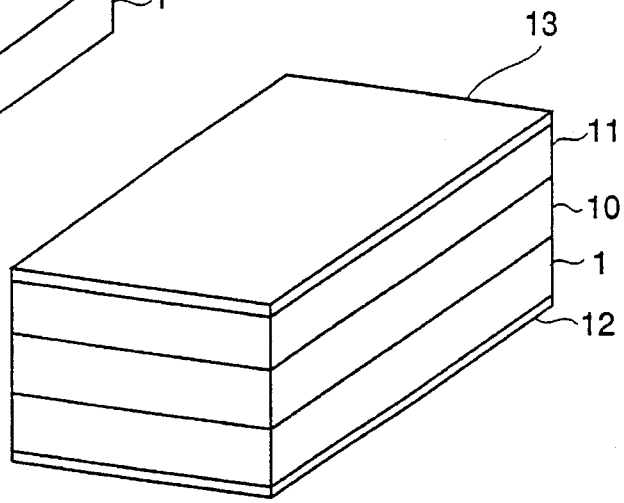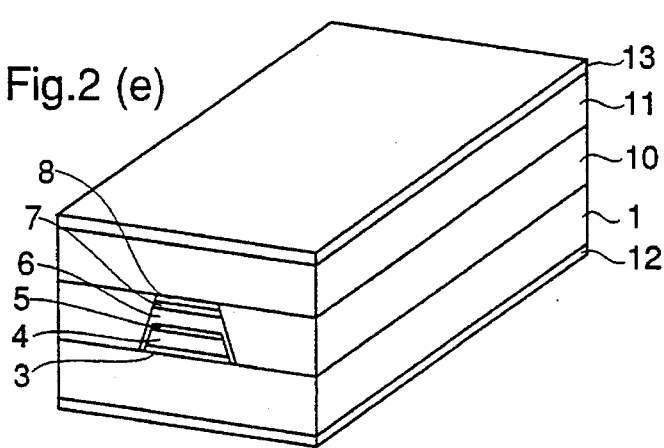

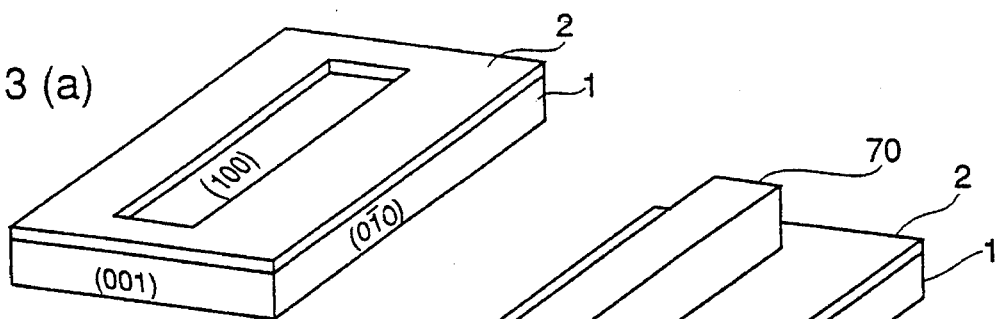
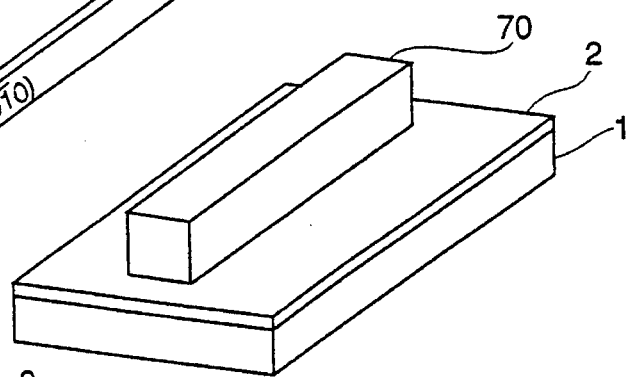
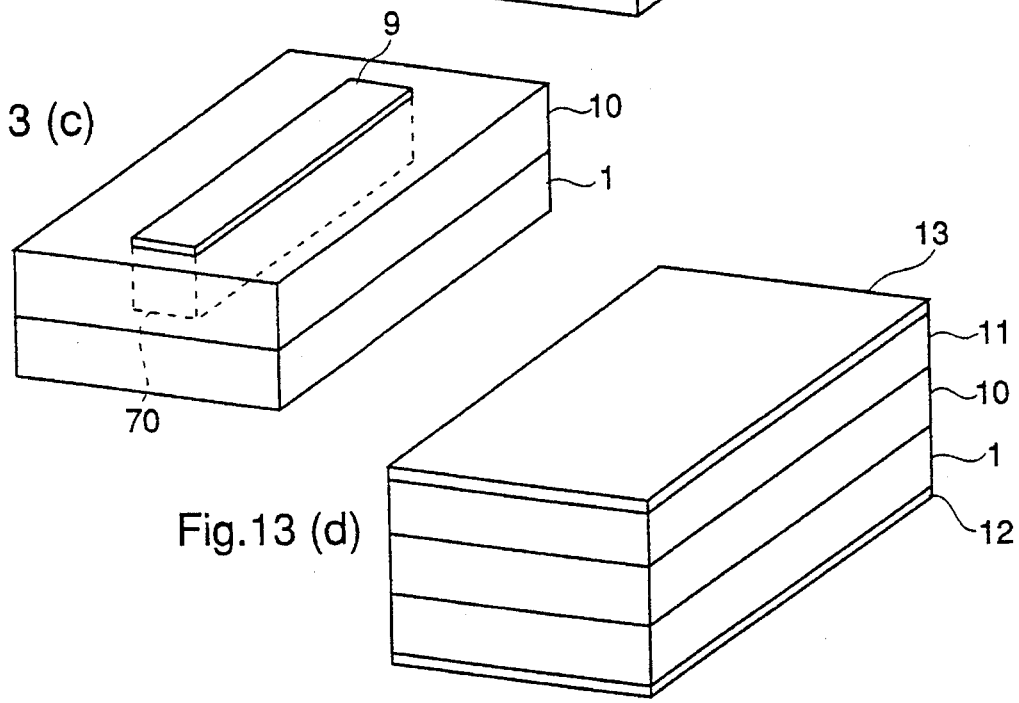
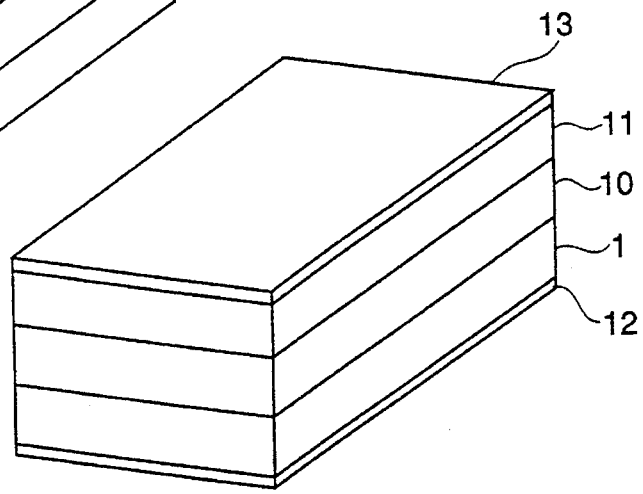
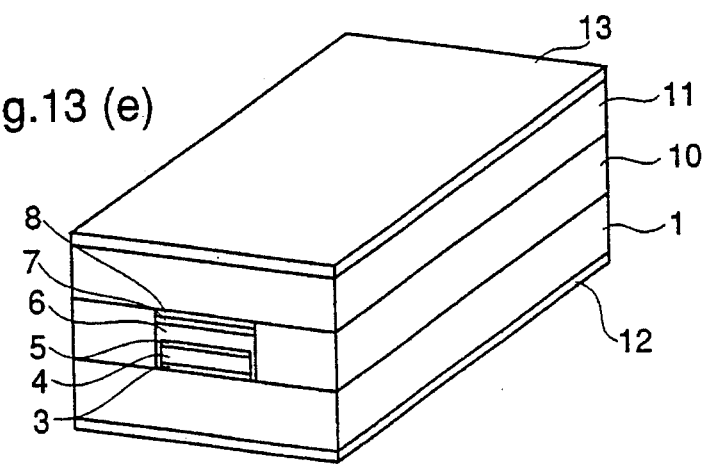

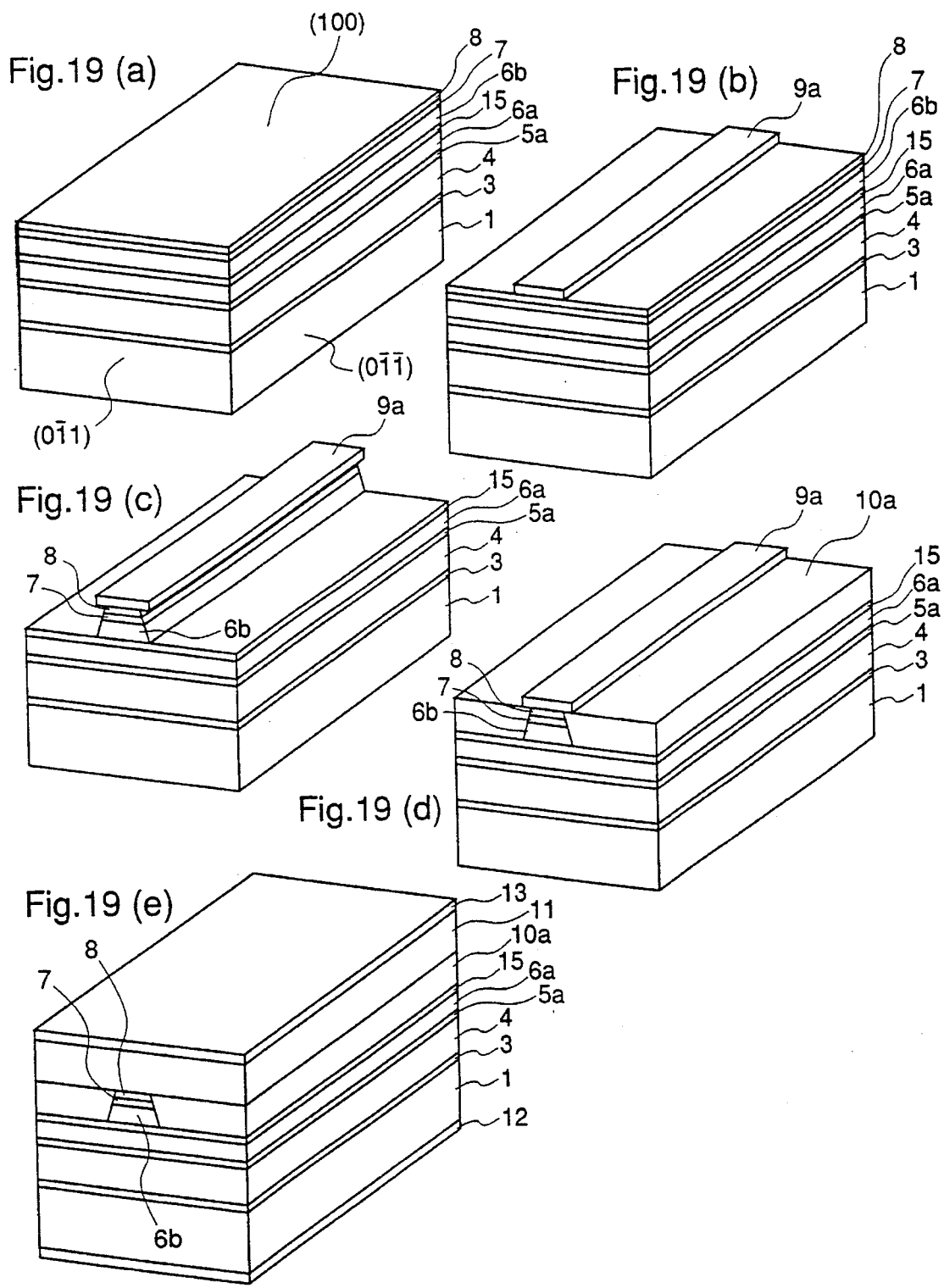
Prior Art

5,604,764

SEMICONDUCTOR LASER

This disclosure is a division of patent application Ser. No. 08/399,649, filed Mar. 7, 1995.

FIELD OF THE INVENTION

The present invention relates to a semiconductor laser including a ridge structure and a method of fabricating the semiconductor laser.

BACKGROUND OF THE INVENTION

FIGS. 18(a)–18(e) and 19(a)–19(e) are sectional views and perspective views illustrating process steps in a method of fabricating a laser diode producing visible light (hereinafter referred to as a visible light laser diode). Reference numeral 1 designates an n type GaAs substrate. An n type GaAs buffer layer 3 is disposed on the n type GaAs substrate 1. An n type AlGaInP lower cladding layer 4 is disposed on the buffer layer 3. A GaInP active layer 5a is disposed on the cladding layer 4. A p type AlGaInP first upper cladding layer 6a is disposed on the active layer 5a. A p type GaInP etching stop layer 15 is disposed on the first upper cladding layer 6a. A stripe-shaped ridge structure is disposed on a part of the etching stop layer 15. The ridge structure comprises a p type AlGaInP second upper cladding layer 6b in contact with the etching stop layer 15, a p type GaInP band discontinuity reduction (hereinafter referred to as BDR) layer 7 disposed on the second upper cladding layer 6b, and a p type GaAs cap layer 8. The stripe-shaped ridge extends in a <01$\bar{1}$> direction. An n type GaAs current blocking layer 10a is disposed on the etching stop layer 15, contacting opposite sides of the ridge structure. A p type GaAs contact layer 11 is disposed on the top of the ridge and on the n type GaAs current blocking layer 10. An n side electrode 12 is disposed on the rear surface of the substrate 1 and a p side electrode 13 is disposed on the contact layer 11. Reference numeral 9a designates a mask for selective etching.

A description is given of the fabrication method of the visible light laser diode.

Initially, as illustrated in FIG. 18(a), there are successively grown on the n type GaAs substrate 1, the n type GaAs buffer layer 3, the n type AlGaInP lower cladding layer 4, the GaInP active layer 5a, the p type AlGaInP first upper cladding layer 6a, the p type GaInP etching stop layer 15, the p type AlGaInP second upper cladding layer 6b, the p type GaInP BDR layer 7, and the p type GaAs cap layer 8. Preferably, these layers are grown by MOCVD (Metal Organic Chemical Vapor Deposition). Thereafter, a mask pattern comprising SiN or SiON is selectively formed on the p type GaAs cap layer 8 by CVD (Chemical Vapor Deposition), and a photoresist is deposited thereon and patterned using a photolithographic technique to form a stripe-shaped selective mask 9a extending in the <01$\bar{1}$> direction.

In the step of FIG. 18(c), using the selective mask 9a, the p type GaAs cap layer 8, the p type GaInP BDR layer 7, and the p type AlGaInP cladding layer 6b are selectively etched until the etching front reaches the etching stop layer 15, thereby forming a stripe-shaped ridge. In the etching process, a tartaric acid containing etchant, a chlorine containing etchant, and a sulfuric acid containing etchant are applied to the cap layer 8, the BDR layer 7, and the cladding layer 6b, respectively.

In the step of FIG. 18(d), the n type GaAs current blocking layer 10a is grown contacting the opposite sides of the stripe-shaped ridge, followed by removal of the mask 9a.

Thereafter, the p type GaAs contact layer 11 is grown over the entire surface. To complete the laser diode, the n side electrode 12 and the p side electrode 13 are formed by vapor deposition (FIG. 18(e)).

A description is given of the operation. When a forward bias voltage is applied across the n side and p side electrodes 12 and 13, current flows between the electrodes and is concentrated in the ridge structure because reactive current is blocked by the p-n-p structure formed by the p type contact layer 11, the n type current blocking layer 10a, and the p type etching stop layer 15. Electrons and holes injected into the active layer 5 in the ridge structure recombine to produce light. The light thus generated is transmitted along the stripe-shaped ridge, reflected and amplified between opposite cleaved facets of the laser (not shown). When the amplification exceeds a threshold, laser oscillation occurs.

In the above-described fabrication process of the semiconductor laser, since there is no etchant that etches GaInP but does not etch AlGaInP, when the p type GaInP BDR layer 7 is etched with a chlorine containing etchant (FIG. 18(c)), the p type AlGaInP second upper cladding layer 6b is also etched. Therefore, the thickness of the remaining portion of the AlGaInP cladding layer 6b after the etching of the GaInP BDR layer 7 varies between a laser diodes simultaneously formed in a wafer or between different positions in a single laser diode. Further, in the subsequent etching of the AlGaInP layer 6b with a sulfuric acid containing etchant, since this etchant has a low selectivity of AlGaInP to GaInP, a portion of the p type GaInP etching stop layer 15 is unfavorably etched away or a portion of the AlGaInP cladding layer 6b remains unetched. Consequently, in the prior art production method, it is very difficult to produce the ridge structure with high accuracy.

Further, in the prior art semiconductor laser, current injected into the ridge structure flows in the resonator length direction, i.e., the transverse direction, at the junction of the ridge and the etching stop layer 15. This current spreading in the transverse direction becomes an obstacle to reduction of in the threshold current and increase in the output power of the laser diode.

SUMMARY OF THE INVENTION

An object of the present invention is to provide a low-threshold and high-output semiconductor laser by improving the processing precision of a ridge structure and suppressing current spreading in the transverse direction.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a method of fabricating a semiconductor laser, a selective growth mask having a stripe-shaped opening in a <011> direction is formed on a {100} surface of a first conductivity type substrate, and a double-heterojunction structure including a first conductivity type cladding layer, an active layer, and a second conductivity type cladding layer is formed on the {100} surface of the substrate using the selective growth mask, thereby forming a stripe-shaped ridge including the active layer and the first conductivity type lower cladding layer which are covered with the second conductivity type upper cladding layer, which stripe-shaped ridge has an ordinary mesa-shaped cross-section in a direction perpendicular to the stripe direction and a symmetrical hexagonal cross-section in the stripe direction. Therefore, the selective etching process for forming the ridge in the conventional method can be dispensed with, whereby variation in the processing precision of the ridge due to the etching process is reduced, and the formation of the ridge is facilitated. Further, the second conductivity type cladding layer and the active layer grown on the side surfaces of the first conductivity type cladding layer are thin and have low dopant incorporating efficiencies, so that regions of the first conductivity type cladding layer at the side surfaces of the ridge have high resistivity. Since those regions block reactive current, all current injected into the ridge is concentrated in the active layer, whereby spreading of current in the resonator width direction is suppressed.

According to a second aspect of the present invention, in a method of fabricating a semiconductor laser, a selective growth mask having a stripe-shaped opening in a <0$\bar{1}$1> direction is formed on a {100} surface of a first conductivity type substrate, and a double-heterojunction structure including a first conductivity type cladding layer, an active layer, and a second conductivity type cladding layer is formed on the {100} surface of the substrate using the selective growth mask, thereby forming a stripe-shaped ridge including the active layer and the first conductivity type lower cladding layer which are covered with the second conductivity type upper cladding layer, which stripe-shaped ridge has a symmetrical hexagonal cross-section in a direction perpendicular to the stripe direction and an isosceles trapezoidal cross-section in the stripe direction. Therefore, the selective etching process for forming the ridge in the conventional method can be dispensed with, whereby variation in the processing precision of the ridge is reduced, and the formation of the ridge is facilitated. Further, the second conductivity type cladding layer and the active layer grown on the side surfaces of the first conductivity type cladding layer are thin and have low dopant incorporating efficiencies, so that regions of the first conductivity type cladding layer at the side surfaces of the ridge have high resistivity. Since those regions block reactive current, all current injected into the ridge is concentrated in the active layer, whereby spreading extension of current in the resonator width direction is suppressed.

According to a third aspect of the present invention, in a method of fabricating a semiconductor laser, a selective growth mask having a stripe-shaped opening in a <001> direction or a <010> is formed on a {100} surface of a first conductivity type substrate, and a double-heterojunction structure including a first conductivity type cladding layer, an active layer, and a second conductivity type cladding layer is formed on the {100} surface of the substrate using the selective growth mask, thereby forming a stripe-shaped rectangular ridge including the active layer and the first conductivity type lower cladding layer which are covered with the second conductivity type upper cladding layer. Therefore, the selective etching process for forming the ridge in the conventional method can be dispensed with, whereby variation in the processing precision of the ridge is reduced, and the formation of the ridge is facilitated. Further, the second conductivity type cladding layer and the active layer grown on the side surfaces of the first conductivity type cladding layer are thin and have low dopant incorporating efficiencies, so that regions of the first conductivity type cladding layer at the side surfaces of the ridge have high resistivity. Since those regions block reactive current, all current injected into the ridge is concentrated in the active layer, whereby spreading of current in the resonator width direction is suppressed.

According to a fourth aspect of the present invention, in the above-described method of fabricating a semiconductor laser, after formation of the stripe-shaped ridge, the selective growth mask is removed, a current blocking layer comprising a material having a band gap energy larger than the band gap energy of the active layer is grown on the {100} surface of the substrate where the ridge is absent to a thickness at least reaching the top of the ridge, and resonator facets of the semiconductor laser are formed in regions where the active layer is absent. Therefore, in the formation of the current blocking layer, a current blocking layer that does not absorb light is formed at the resonator facets, whereby window structures are easily produced.

According to a fifth aspect of the present invention, in the above-described method of fabricating a semiconductor laser, the opposite sides of the ridge are the resonator facets of the semiconductor laser. Therefore, the second conductivity type cladding layer that does not absorb light are is grown formed at the resonator facets, so that window structures are easily produced.

According to a sixth aspect of the present invention, in the above-described method of fabricating a semiconductor laser, the active layer comprises a material having a higher migration rate than materials of other layers included in the ridge, and the selective Growth of the ridge is performed under conditions that facilitate migrations of the materials of the respective layers included in the ridge. Therefore, unwanted growth of the active layer on the side surfaces of the first conductivity type cladding layer is prevented.

According to a seventh aspect of the present invention, in the above-described method of fabricating a semiconductor laser, the second conductivity type cladding layer is a p type cladding layer, and the selective growth of the second conductivity type cladding layer is performed while supplying a gaseous mixture of a p type dopant source and an n type dopant source in a prescribed ratio so that portions of the second conductivity type cladding layer at the side surfaces of the ridge have a high resistivity. Therefore, the resistivity of portions of the first conductivity type cladding layer at the side surfaces of the ridge is further increased, whereby the reactive current is surely reduced.

According to an eighth aspect of the present invention, in the above-described method of fabricating a semiconductor laser, the first conductivity type cladding layer is a p type cladding layer, and the selective growth of the first conductivity type cladding layer is performed while supplying a gaseous mixture of a p type dopant source and an n type dopant source in a prescribed ratio so that portions of the first conductivity type cladding layer at the side surfaces of the ridge have a high resistivity. Therefore, the resistivity of portions of the first conductivity type cladding layer at the side surfaces of the ridge is further increased, whereby the reactive current is surely reduced.

According to a ninth aspect of the present invention, a semiconductor laser includes a first conductivity type semiconductor substrate having a {100} oriented surface, and a double heterojunction structure comprising a first conductivity type lower cladding layer disposed on the {100} surface of the substrate, an active layer disposed on a {100} surface of the first conductivity type lower cladding layer, and a second conductivity type upper cladding layer covering the active layer and the first conductivity type lower cladding layer, wherein the double-heterojunction structure is a stripe-shaped ridge extending in a <011> direction and having an ordinary mesa-shaped section. Therefore, the greater part of current injected into the ridge is concentrated in the active layer that is a light emission region, whereby spreading of current in the resonator width direction is suppressed.

According to a tenth aspect of the present invention, a semiconductor laser includes a first conductivity type semiconductor substrate having a {100} oriented surface, and a double heterojunction structure comprising a first conductivity type lower cladding layer disposed on the {100} surface of the substrate, an active layer disposed on a {100} surface of the first conductivity type lower cladding layer, and a second conductivity type upper cladding layer covering the active layer and the first conductivity type lower cladding layer, wherein the double-heterojunction structure is a stripe-shaped ridge extending in a <011> direction or a <010> direction and having a symmetrical hexagonal cross-section. Therefore, the greater part of current injected into the ridge is concentrated in the active layer that is a light emission region, whereby spreading of current in the resonator width direction is suppressed.

According to an eleventh aspect of the present invention, a semiconductor laser includes a first conductivity type semiconductor substrate having a {100} oriented surface, and a double heterojunction structure comprising a first conductivity type lower cladding layer disposed on the {100} surface of the substrate, an active layer disposed on a {100} surface of the first conductivity type lower cladding layer, and a second conductivity type upper cladding layer covering the active layer and the first conductivity type lower cladding layer, wherein the double-heterojunction structure is a stripe-shaped ridge extending in a <001> direction and having a rectangular section. Therefore, the greater part of current injected into the ridge is concentrated in the active layer that is a light emission region, whereby spreading extension of current in the resonator width direction is suppressed.

According to a twelfth aspect of the present invention, in the above-described semiconductor laser, the second conductivity type cladding layer covers opposite sides of the stripe-shaped ridge in the stripe direction, and the ridge is buried in a current blocking layer having a band gap energy larger than the band gap energy of the active layer. Therefore, light absorption at the resonator facets is suppressed by the second conductivity type cladding layer and the current blocking layer, so that the resonator facets serve as window structures.

According to a thirteenth aspect of the present invention, in the above-described semiconductor laser, portions of the ridge at the side surfaces and in the vicinity of the first conductivity type cladding layer have a high resistivity. Therefore, the high-resistance portions of the first conductivity type cladding layer at the side surfaces of the ridge block reactive current and all current injected into the ridge is concentrated in the active layer, whereby spreading of current in the resonator width direction is further suppressed.

According to a fourteenth aspect of the present invention, in the above-described semiconductor laser, the opposite side surfaces of the ridge provide resonator facets of the laser, and the second conductivity type cladding layer covers the active layer and the first conductivity type cladding layer at the resonator facets of the laser. Therefore, light absorption at the resonator facets is suppressed by the second conductivity type cladding layer, so that the resonator facets serve as window structures.

BRIEF DESCRIPTION OF THE DRAWINGS

FIGS. 2(a)–2(e) are perspective views illustrating a method of fabricating a semiconductor laser in accordance with the first embodiment of the present invention.

FIGS. 13(a)–13(e) are perspective views illustrating the method of fabricating a semiconductor laser according to the sixth embodiment of the present invention.

FIGS. 18(a)–18(e) and 19(a)–19(e) are sectional views and perspective views illustrating a method of fabricating a semiconductor laser according to the prior art.

DETAILED DESCRIPTION OF THE PREFERRED EMBODIMENTS

[Embodiment 1]

Figure 1:
FIGS. 1(a)–1(e) are sectional views illustrating a method of fabricating a semiconductor laser in accordance with a first embodiment of the present invention.
Figure 1:
Figure 1:
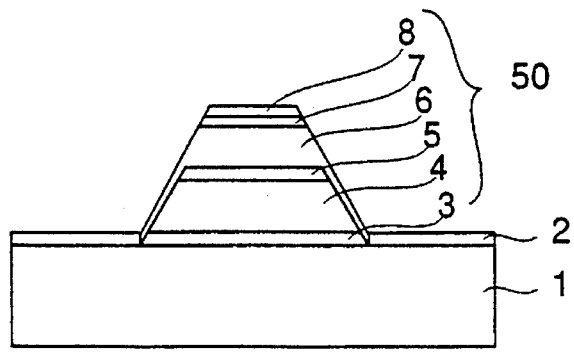
Figure 1:
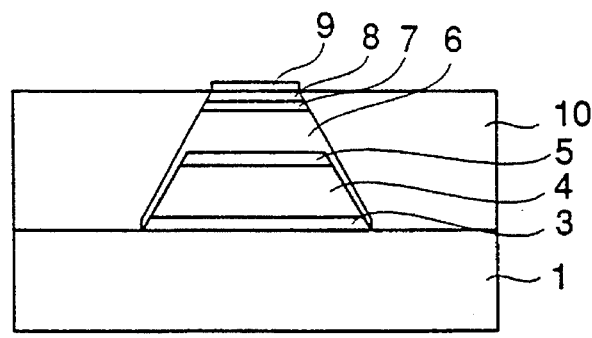
Figure 1:
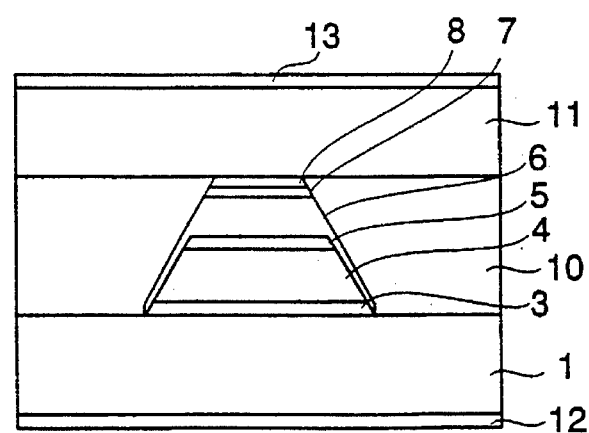

FIGS. 1(a)–1(e) are sectional views illustrating process steps in a method of fabricating a semiconductor laser in accordance with a first embodiment of the present invention. These sectional views are in a plane parallel to a (011) plane. FIGS. 2(a)–2(e) are perspective views illustrating the process steps. In these figures, reference numeral 1 designates an n type GaAs substrate having a (100) surface orientation. An n type GaAs buffer layer 3 is disposed on a part of the surface of the substrate 1. An n type AlGaInP lower cladding layer 4 is disposed on the buffer layer 3, and the lower cladding layer 4 is about 1.5 µm thick at a part on a (100) surface of the buffer layer 3. A GaInP active layer 5 is disposed on the cladding layer 4, and the active layer 5 is about several hundreds of angstroms thick at a part on a (100) surface of the cladding layer 4. A p type AlGaInP cladding layer 6 is disposed on the active layer 5, and the cladding layer 6 is about 1.5 µm thick at a part on a (100) surface of the active layer 5. A p type GaInP band discontinuity reduction (BDR) layer 7 is disposed on the cladding layer 6, and the BDR layer is about 0.1 µm thick at a part on a (100) surface of the cladding layer 6. The BDR layer 7 may comprise other materials, for example, p type AlGaAs that has a band gap energy intermediate between band gap energies of AlGaInP and GaAs. A p type GaAs cap layer 8 is disposed on the p type GaInP BDR layer 7, and the cap layer is 0.3~0.4 µm thick at a part on a (100) surface of the BRD layer 7. The n type GaAs buffer layer 3, the n type AlGaInP cladding layer 4, the active layer 5, the p type AlGaInP cladding layer 6, the p type GaInP BDR layer 7, and the p type GaAs cap layer 8 are formed in a stripe-shaped ridge 50.

A current blocking layer 10 is disposed on the n type GaAs substrate 1, contacting both sides of the ridge. The current blocking layer 10 is a high-resistivity layer comprising, for example, $Al_yGa_{1-y}InP$. In the conventional semiconductor laser, the cladding layer, the current blocking layer, and the contact layer provide a p-n-p (or n-p-n) structure that blocks reactive current from flowing outside of the ridge 50. On the other hand, in the laser structure according to the first embodiment of the present invention, since no p-n-p structure is produced, even when an n type current blocking layer is provided, reactive current is not blocked. In order to block the reactive current, the current blocking layer 10 must have a high resistivity. Therefore, a high resistivity layer, such as an $Al_yGa_{1-y}InP$ or AlInP layer, is employed as the current blocking layer 10. The resistivity of the $Al_yGa_{1-y}InP$ layer increases with an increase in the Al composition ratio y. Although an undoped $Al_yGa_{1-y}InP$ layer has a high resistivity, oxygen may be incorporated, and the resistivity increases with an increase in the oxygen concentration. Preferably, the oxygen concentration is higher than $1.0 E+16/cm^3$. When the Al composition ratio y of the $Al_yGa_{1-y}InP$ layer is high, oxygen is easily incorporated into that layer.

A p type GaAs contact layer 11 is disposed on the current blocking layer 10 and on the cap layer 8. A p side electrode 13 is disposed on the contact layer 11, and an n side electrode 12 is disposed on the rear surface of the substrate 1. The contact layer 11 may comprise p type Ge that lattice-matches with the GaAs substrate 1, in place of p type GaAs. In this case, since p type Ge provides the contact layer 11 with a lower resistivity compared to p type GaAs, the contact between the contact layer 11 and the p side electrode 13 is improved. Further, reference numeral 2 designates an insulating film, such as SiN or SiO, and numeral 9 designates an insulating mask, such as SiN.

A description is given of the production process.

Initially, an insulating film 2, such as SiN or SiO, is formed on the (100) surface of the n type GaAs substrate 1 shown in FIG. 1(a) and patterned to form a stripe-shaped opening extending in the [011] direction using a photolithographic technique, whereby a first insulating growth mask 2 for selective growth (hereinafter referred to as a first selective growth mask) is formed (FIGS. 1(b) and 2(a)).

As illustrated in FIG. 1(c), in an MOCVD process using the first selective mask 2, the n type GaAs buffer layer 3, the n type AlGaInP cladding layer 4, the $Al_xGa_{1-x}InP$ active layer 5, the p type AlGaInP cladding layer 6, the BDR layer 7, and the p type GaAs cap layer 8 are successively grown on the substrate 1. The grown layers form a double heterojunction structure of the visible light semiconductor laser.

As described in Journal of Crystal Growth 73 (1985), 73–76 by K. Kamon, S. Takagishi, and H. Mori, when an SiN mask having a stripe-shaped opening extending in the <011> direction is formed on a {100} surface of a GaAs substrate and AlGaAs is grown on the {100} surface exposed in the opening of the SiN mask, AlGaAs grows forming a stripe-shaped ridge having an ordinary mesa-shaped cross-section in a direction perpendicular to the stripe direction and a symmetrical hexagonal cross-section in the stripe direction. More specifically, each of the opposite ends of the stripe-shaped ridge in the stripe direction protrudes outward in a triangular shape. One of the triangular end portions of the ridge has an upper surface in {111}A plane and a lower surface in {$\bar{1}11$}B plane, and one of the opposite sides of the ridge in the direction perpendicular to the stripe is in {$11\bar{1}$}B plane. The reason why the crystal growth in the direction perpendicular to the stripe is stopped at the {$11\bar{1}$B plane is that the attachment coefficient of the material to the B plane is small. Therefore, also in this first embodiment of the invention, as illustrated in FIG. 2(b), the successive growth of the n type GaAs buffer layer 3, the n type AlGaInP cladding layer 4, the $Al_xGa_{1-x}InP$ active layer 5, the p type AlGaInP cladding layer 6, the BDR layer 7, and the p type GaAs cap layer 8 results in a stripe-shaped ridge 50 having an ordinary mesa-shaped cross-section in the direction perpendicular to the stripe and a symmetrical hexagonal cross-section in the stripe direction wherein the opposite ends of the ridge protrude outward in triangular shape.

The crystal growth rate on the {$11\bar{1}$}B plane is considerably smaller than the growth rate on the flat {100} surface. Therefore, when the above-described layers 3 to 8 are successively grown to form the stripe-shaped ridge 50, the thickness of each layer grown on the ($11\bar{1}$B) side surface of the ridge 50 is very thin compared to the thickness of that layer grown in the direction perpendicular to the (100) surface. FIG. 1(c) shows a sectional view of the stripe-shaped ridge 50 after the crystal growth. As shown in FIG. 1(c), the opposite ends of the active layer 5 in the direction perpendicular to the stripe of the ridge 50 are covered with the cladding layer 6, and the active layer 5 is completely buried in the ridge 50.

After removal of the first selective growth mask 2 by wet or dry etching, a second insulating growth mask 9 for selective growth (hereinafter referred to as a second selective growth mask) is formed on the top of the ridge 50. Using the second selective mask 9, a high-resistance current blocking layer 10 is grown on the n type GaAs substrate 1, contacting the opposite sides of the ridge 50 (FIGS. 1(d) and 2(c)). Since the GaInP active layer 5 is surrounded by the upper and lower cladding layers 4 and 6, it is not adversely affected by the removal of the first insulating growth mask 2, the formation of the second insulating growth mask 9, and the regrowth of the current blocking layer 10. Consequently, both sides of the active layer are embedded with the current blocking layer 10 without damaging the active layer 5.

After removal of the second selective growth mask 9 by wet or dry etching, the p type GaAs contact layer 11 is grown on the cap layer 8 and on the current blocking layer 10. Thereafter, an n side electrode 12 and a p side electrode 13 are formed on the rear surface of the substrate 1 and on the contact layer 11, respectively (FIGS. 1(e) and 2(d)). Finally, the structure is cleaved at positions where the active layer 5 is present to form a semiconductor laser diode about 650 μm long in the resonator length direction.

A description is given of the operation.

When a forward bias voltage is applied across the n side electrode 12 and the p side electrode 13, a current flows between the electrodes and is concentrated in the ridge 50 because reactive current is blocked by the high-resistance current blocking layer 10a, and electrons and holes are injected into the active layer 5 in the ridge 50 and recombine to generate light. The light thus generated travels along the stripe-shaped ridge 50 and is reflected and amplified between a pair of cleaved facets (not shown). When the amplification rate exceeds a threshold, laser oscillation occurs. As described above, since the growth rate on the (11$\bar{1}$)B plane is very small, the active layer 5 grows very thin on the side surface of the cladding layer 4 in the ridge 50, and laser light is hardly produced in the very thin portion of the active layer on the side surface of the ridge. Further, the active layer 5 and the p type AlGaInP cladding layer 6 grown on the (11$\bar{1}$) plane of the cladding layer 4 are sufficiently thin but the resistances of these layers are sufficiently high, reactive current flowing toward the (11$\bar{1}$) plane of the n type AlGaInP cladding layer 4 is blocked by the high-resistance active layer 5 and the high-resistance p type AlGaInP cladding layer 6.

In the semiconductor laser according to this first embodiment of the invention, the ridge 50 is formed by selective growth using an MOCVD process, in contrast to the conventional method in which the ridge is formed by selective etching of grown layers with different etchants, whereby the process of forming the ridge is simplified. In addition, processing precision of the ridge does not vary due to variations in the selective etching process.

Further, the reactive current flowing toward the (11$\bar{1}$) plane of the n type AlGaInP cladding layer 4 is blocked by the high-resistance portions of the active layer 5 and the p type AlGaInP cladding layer 6 on the (11$\bar{1}$) plane of the n type AlGaInP cladding layer 4, so that current flowing into the ridge 50 is concentrated in the active layer 5 on the (100) surface, resulting in a low-threshold and high-output semiconductor laser with suppressed spreading of current in the resonator width direction.

Figure 3:
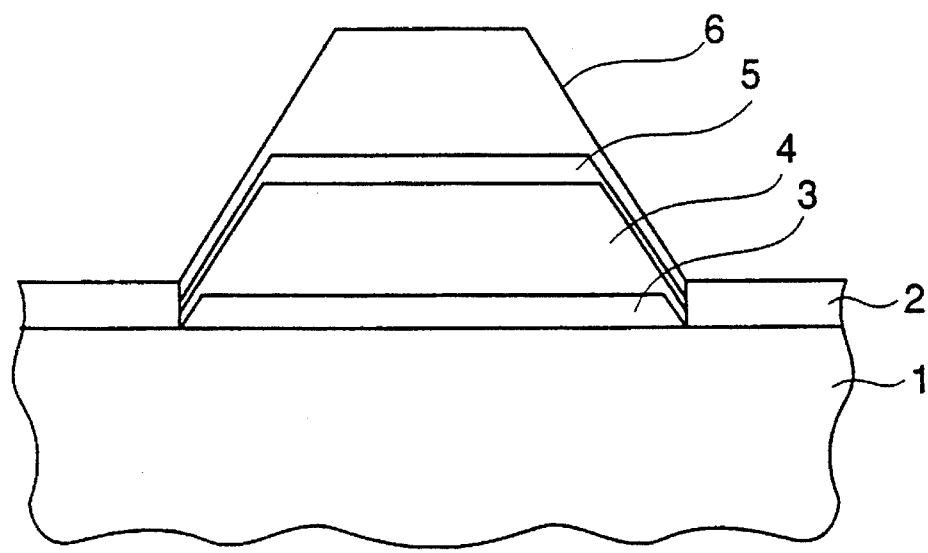
FIGS. 3(a) and 3(b) are sectional views for explaining growth condition dependence of growth rate of an active layer on a (111) surface according to the first embodiment of the present invention.
Figure 3:
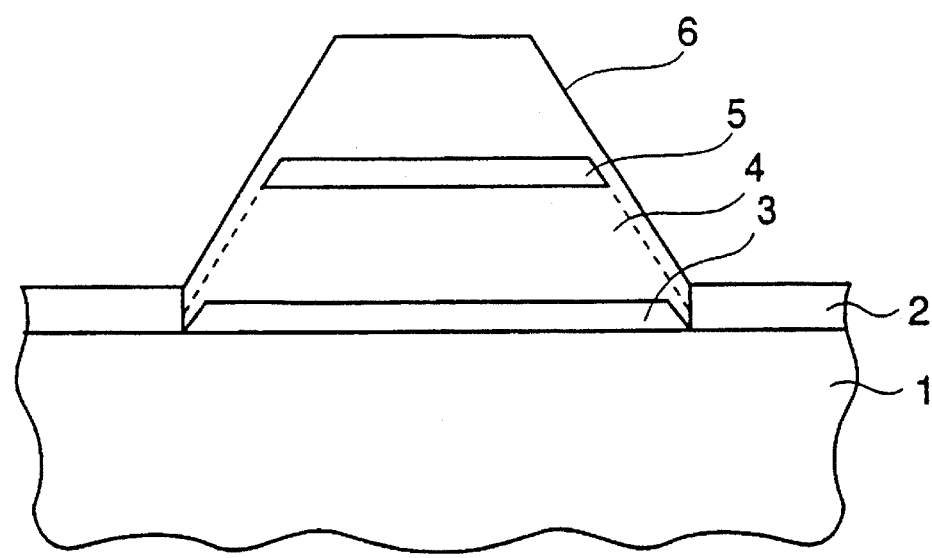

In the selective growth of the ridge 50, the growth rate on the {11$\bar{1}$} plane is reduced when the growth conditions are selected so as to facilitate migration of growth materials, for example, low pressure, high temperature, and a high rotation speed if the substrate is rotated. On the other hand, the growth rate on the (11$\bar{1}$} plane is increased when the growth conditions are selected so as to reduce migration of growth materials. Further, a material with a high migration rate has a high growth rate on the {11$\bar{1}$} plane, and a material with a low migration rate has a low growth rate on the {11$\bar{1}$} plane. For example, when the active layer 5 comprising GaInP is grown using an ordinary MOCVD method, a very thin active layer grows on the opposite sides of the stripe-shaped ridge 50 in the direction perpendicular to the stripe as shown in FIG. 3(a). However, since the migration rate of GaInP is higher than the migration rate of AlGaInP, the growth rate of GaInP on the {11$\bar{1}$} plane is smaller than that of AlGaInP.

Utilizing the above-described characteristics, in the selective growth of the ridge 50, the GaInP active layer 5 is grown with growth conditions selected to facilitate the migration of the respective materials, followed by growth of the AlGaInP cladding layer 6. In this case, since the growth of the GaInP active layer 5 on the (11$\bar{1}$) plane is suppressed, the GaInP active layer 5 is grown only on the (100) surface of the n type AlGaInP cladding layer 4 and embedded in the ridge by the n type and p type AlGaInP cladding layers 4 and 6, as shown in FIG. 3(b). In this structure, emission of laser light at the (11$\bar{1}$) plane is suppressed, whereby the characteristics of the semiconductor laser are improved. In FIGS. 3(a)–3(b), the same reference numerals as in FIG. 2(e) designate the same or corresponding parts.

As described above, according to the first embodiment of the present invention, the stripe-shaped ridge 50 extending in the [011] direction is formed by selectively growing the lower cladding layer 4, the active layer 5, and the upper cladding layer 6 using the insulating mask 2 having a stripe-shaped opening in the [011] direction. Therefore, the ridge 50 is easily formed with high processing precision, resulting in a low-threshold and high-output semiconductor laser with suppressed extension of current in the transverse direction.

While in the above-described first embodiment the laser structure includes a current blocking layer comprising high-resistance $Al_yGa_{1-y}InP$, it may include a current blocking layer comprising a material other than the high-resistance material. By varying the material and the structure of the current blocking layer, it is possible to improve characteristics of a semiconductor laser in which both sides of the active layer are embedded in the current blocking layer or a semiconductor laser having a refractive index waveguide structure in which the refractive indices at both sides of the active layer are varied. Hereinafter, variations of the current blocking layer according to the first embodiment of the invention are described.

For example, high-resistance $Al_zGa_{1-z}As$ may be employed for the current blocking layer. Although undoped $Al_zGa_{1-z}As$ has a high resistivity, the resistivity can be further increased by incorporating oxygen. The resistivity increases with an increase in the Al composition and an increase in the oxygen concentration. Also in this case, the same effect as provided by the high-resistance $Al_yGa_{1-y}InP$ layer is achieved.

Further, a high-resistance crystal having a lattice constant different from the lattice constant of the GaAs substrate, such as $Al_qIn_{1-q}As$ or Fe-doped InP, may be employed for the current blocking layer.

Alternatively, a band discontinuity between the current blocking layer and the contact layer may be used to block reactive current. For example, when a II–VI crystal, such as ZnSe, is employed as the current blocking layer, an energy band edge discontinuity occurs between the II–VI crystal and the p type GaAs contact layer. The energy band edge discontinuity blocks reactive current.

The current blocking layer may have a multilayer structure or a superlattice structure. In this case, the light confining efficiency in the transverse direction can be controlled by appropriately selecting thicknesses, compositions, and crystalline structures of the respective layers, whereby the light emitting efficiency of the laser is increased. For example, when the ridge embedding layer, i.e., the current blocking layer, has a double-layer structure comprising a p type lower GaAs layer and an n type upper GaAs layer, a p-n-p structure is produced by the p type GaAs layer, the n type GaAs layer, and the p type contact layer, which p-n-p structure blocks current. Likewise, a double-layer ridge embedding structure comprising a p type lower GaAs layer and an n type upper GaAs layer may be grown on an n type layer. Alternatively, a high-resistance layer may be grown on the n type layer. Further, the above-described double-layer ridge embedding structure may be grown repeatedly to produce a multilayer ridge embedding structure.

Figure 7:
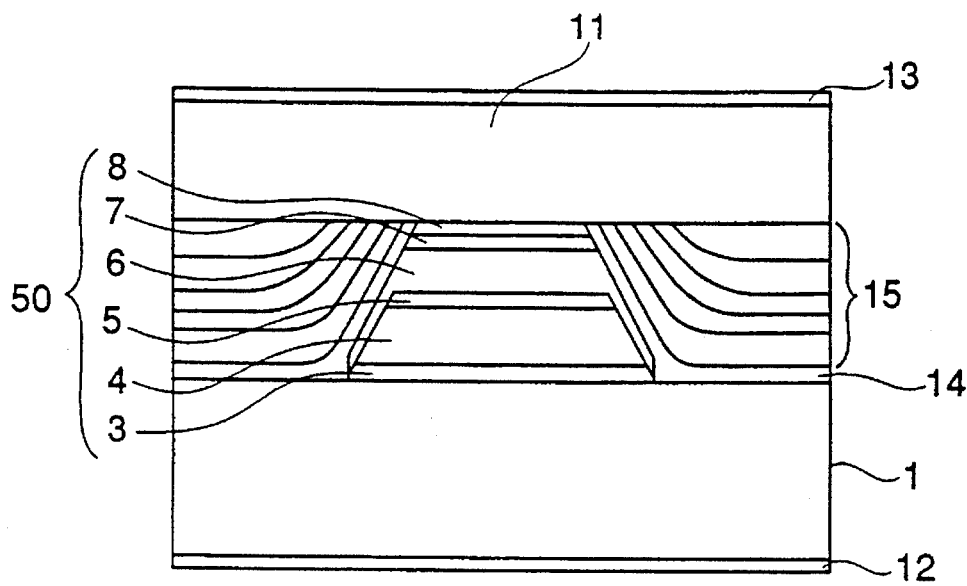
FIG. 7 is a sectional view illustrating a semiconductor laser including a current blocking layer having a multilayer structure according to a variation of the first embodiment of the present invention.

When a multilayer structure current blocking layer is produced, a high-resistance layer may be included in the multilayer structure. In this case, since the high-resistance layer blocks reactive current flow, layers disposed on and under the high-resistance layer may comprise any semiconductor material having any conductivity type. For example, as shown in FIG. 7, after covering the side surfaces of the ridge 50 and the front surface of the GaAs substrate 1 with an $Al_xGa_{1-x}InP$ high-resistance layer 14, the ridge 50 is embedded in an AlGaInP/GaInP multilayer structure.

For the multilayer or superlattice structure, the following materials may be employed: AlGaInP/GaInP, $Al_xGa_{1-x}InP$ ($0 \leq x \leq 1$)/$Al_yGa_{1-y}InP$ ($0 \leq v \leq 1$), AlGaInP/GaAs, $Al_xGa_{1-x}InP$ ($0 \leq x \leq 1$)/$Al_rGa_{1-r}As$ ($0 \leq r \leq 1$), $Al_rGa_{1-r}As$ ($0 \leq r \leq 1$)/$Al_tGa_{1-t}As$ ($0 \leq t \leq 1$), $Ga_{x1}As_{y1}P_{y1}$ ($0 \leq x1 \leq 1$, $0 \leq y1 \leq 1$)/$Ga_{x2}In_{1-x2}As_{y2}P_{1-y2}$ ($0 \leq x2 \leq 1$, $0 \leq y2 \leq 1$).

Figure 8:
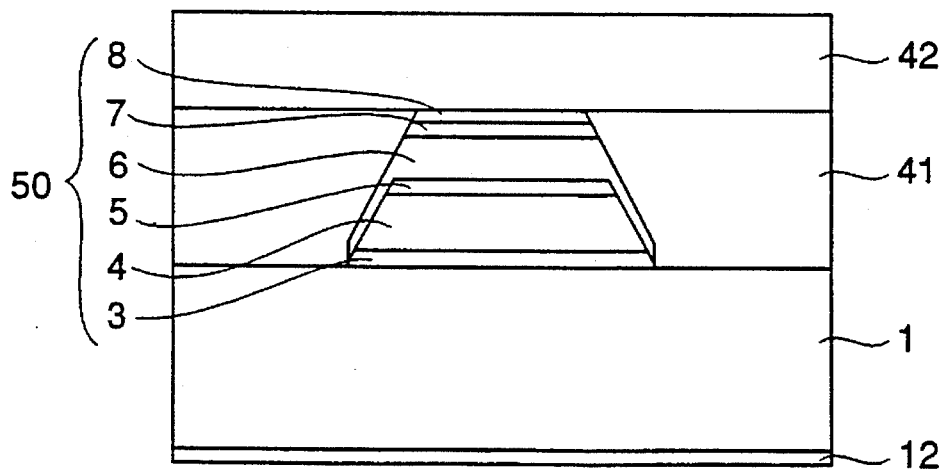
FIG. 8 is a sectional view illustrating a semiconductor laser including a current blocking layer comprising an insulating film according to a variation of the first embodiment of the present invention.

Alternatively, materials other than semiconductor materials may be employed for the current blocking layer. For example, in a laser structure shown in FIG. 8, a current blocking layer 41 comprises an insulating material, such as polyimide. In production, after selective growth of the ridge 50, an insulating layer 41, such as polyimide, is deposited on the substrate 1, contacting the opposite sides of the ridge 50, followed by formation of an electrode 42 on the ridge 50 and on the insulating layer 41. In the ridge structure of the semiconductor laser according to the first embodiment of the invention, since the active layer 5 in the ridge 50 is covered with the cladding layer 6, it is not adversely affected by processing after the crystal growth. That is, since the active layer 5 is protected when the ridge is embedded with the insulating layer 41, the laser characteristics are not degraded. Accordingly, the degree of freedom in selection of the material of the current blocking layer and the degree of freedom in design are increased. For example, the current blocking layer may comprise a material whose refractive index can be varied in response to a by voltage.

In the step of FIG. 1(c), when the second selective mask 9 comprises a material that is not etched by an etchant that etches the first selective growth mask 2 on the substrate 1, after the formation of the ridge, the second selective growth mask 9 may be selectively formed on the ridge using the first selective growth mask 2. In this case, the formation of the second selective growth mask 9 is facilitated.

[Embodiment 2]

Figure 9:
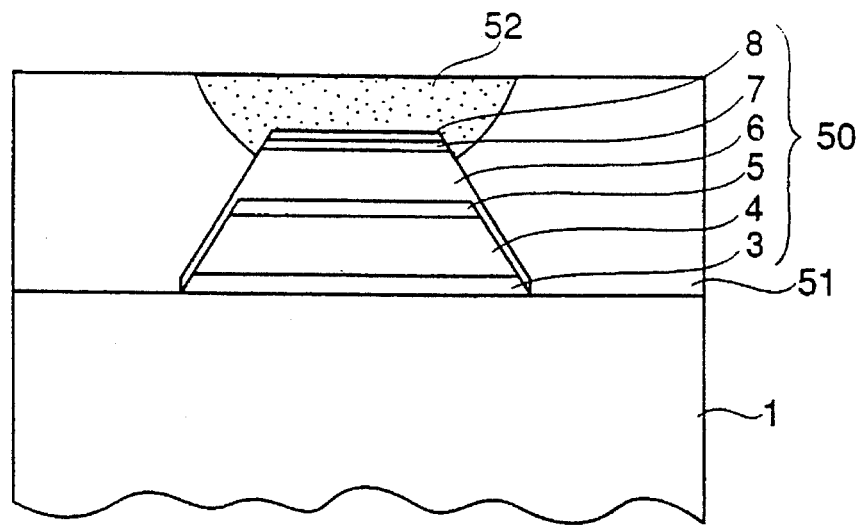
FIG. 9 is a sectional view illustrating a semiconductor laser in accordance with a second embodiment of the present invention.

In the above-described first embodiment of the invention, after formation of the ridge 50 and removal of the first selective growth mask 2, the second selective growth mask 9 is formed on the (100) surface of the ridge and, thereafter, the ridge is embedded with the current blocking layer 10 using the second selective growth mask, followed by removal of the second selective mask and formation of the contact layer 11 on the ridge and on the current blocking layer. In this second embodiment of the invention, as illustrated in FIG. 9, after formation of the ridge 50 and removal of the first selective growth mask (not shown), an undoped GaAs current blocking layer 51 or a current blocking layer comprising a p type GaAs layer and an undoped GaAs layer is grown on the substrate 1 at the opposite sides of the ridge 50 until the ridge is completely embedded within current blocking layer 51 and the surface of the structure becomes flat. Thereafter, Zn is diffused from the surface of the current blocking layer 51 into a region above the ridge 50 to form a Zn diffused region 52 in the current blocking layer 51, followed by formation of p side and n side electrodes (not shown).

The Zn diffusion is performed by vapor phase diffusion or solid phase diffusion. In case of vapor phase diffusion, an insulating film is formed on the undoped current blocking layer 51 and patterned to form an opening opposite the ridge 50, and the vapor phase diffusion of Zn is carried out until the diffusion front reaches the upper surface of the ridge 50, thereby forming the Zn diffused region 52. In case of solid phase diffusion, a stripe-shaped ZnO or ZnO/SiO film (not shown) is formed on a portion of the undoped current blocking layer 51 opposite the stripe-shaped ridge 50, and Zn is diffused into the current blocking layer 51 by heating the ZnO or ZnO/SiO film until the diffusion front reaches the upper surface of the ridge, thereby forming the Zn diffused region 52. Also in this second embodiment of the invention, the same effects as described in the first embodiment are achieved.

Figure 10:
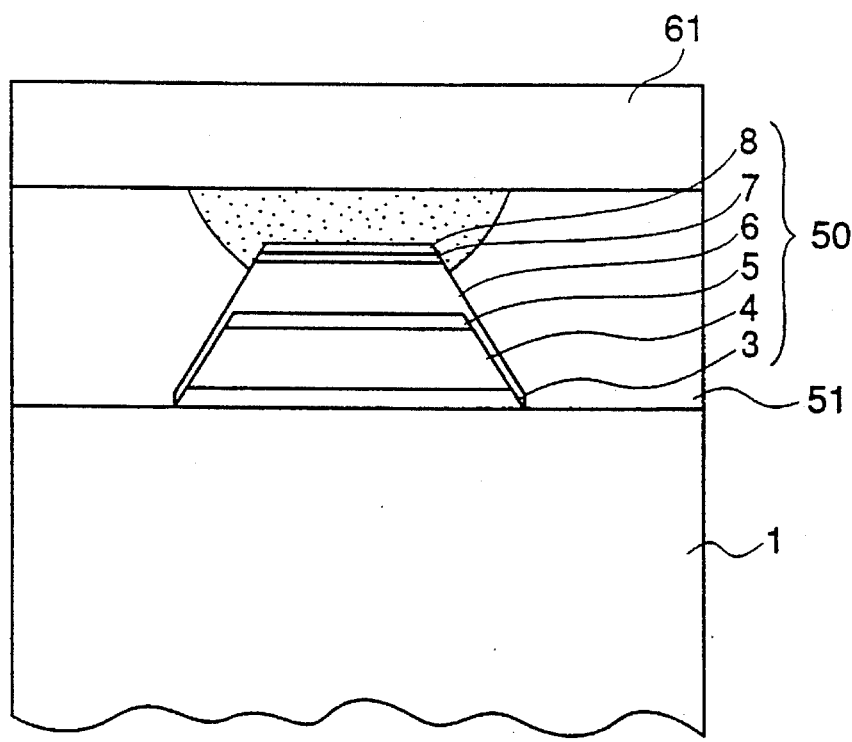
FIG. 10 is a sectional view illustrating a semiconductor laser according to a variation of the second embodiment of the present invention.

As shown in FIG. 10, after formation of the Zn diffused region 52, a p type GaAs contact layer 61 may be grown on the current blocking layer 51 to make a good contact with the p side electrode 13.

Further, the undoped current blocking layer 51 may comprise a semiconductor crystal having a high resistivity in its undoped state, such as intrinsic (hereinafter referred to as i type) GaInP, i type AlGaInP, or i type AlGaAs. Alternatively, a semiconductor crystal having a whose resistivity increased by adding oxygen may be used. When an undoped i type GaInP layer or an undoped i type AlGaAs layer is employed, before growth of the p type GaAs contact layer, a p type buffer layer comprising the same crystal as the undoped layer should be grown. When an i type AlGaInP layer is used as the current blocking layer, the growth of the ridge 50 is stopped when the p type AlGaInP cladding layer is grown, that is, the p type GaInP BDR layer and the p type GaAs cap layer are not grown. After removal of the selective growth mask, the ridge 50 is embedded with an i type AlGaInP current blocking layer, and Zn is diffused until the diffusion front reaches the p type AlGaInP layer at the upper surface of the ridge 50. Thereafter, a p type AlGaInP buffer layer and a contact layer are successively grown, followed by formation of electrodes. In order to reduce the energy band edge band discontinuity, the contact layer has a laminated structure of a p type GaInP BDR layer and a p type GaAs contact layer. Also in the above-described case using an undoped current blocking layer, the same effects as described in the first embodiment are obtained.

Although in the above-described second embodiment the ridge embedding layer comprises a single layer, it may have a multilayer structure, such as p-GaAs/i-GaInP, i-GaInP/i-AlGaInP, or p-GaAs/i-GaInP/i-AlGaInP. In this case, the contact layer comprises p type GaAs. Also in this case, the same effects as described above are achieved.

[Embodiment 3]

Figure 11:
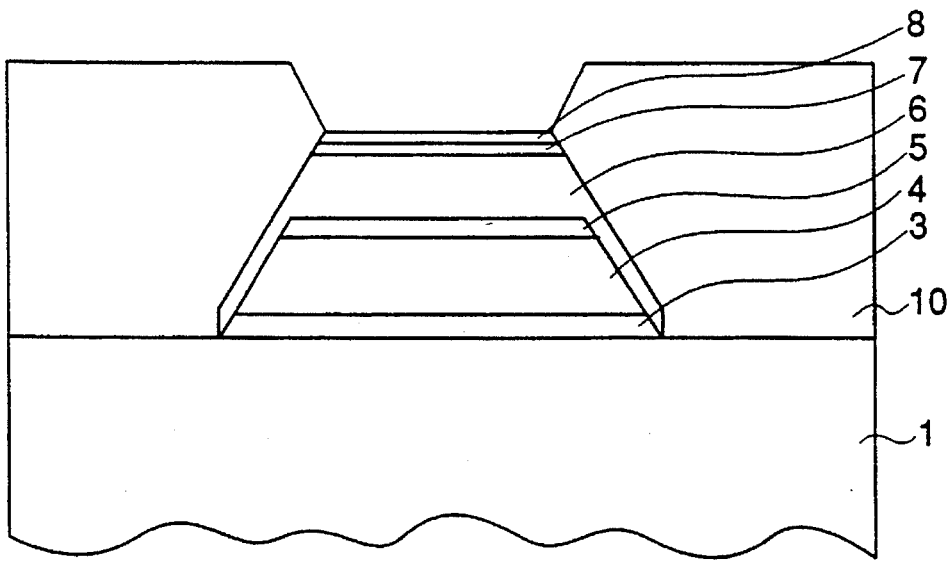
FIGS. 11(a) and 11(b) are sectional views illustrating major process steps in a method of fabricating a semiconductor laser in accordance with a third embodiment of the present invention.
Figure 11:
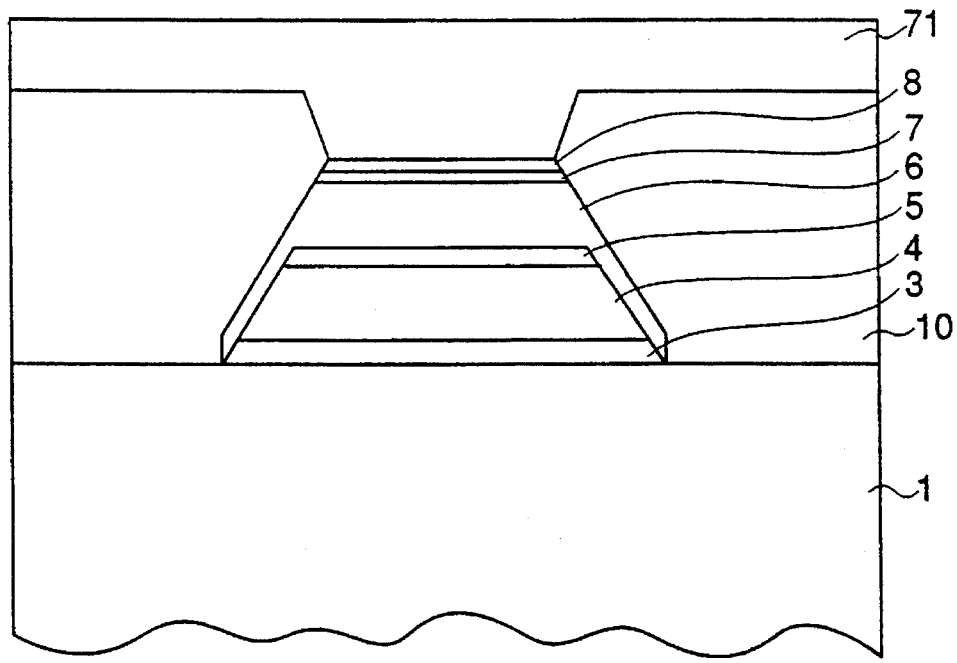
Figure 12:
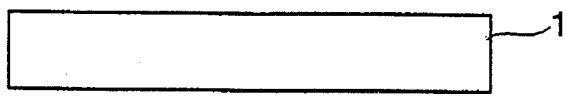
FIGS. 12(a)–12(e) are sectional views illustrating a method of fabricating a semiconductor laser in accordance with a sixth embodiment of the present invention.
Figure 12:
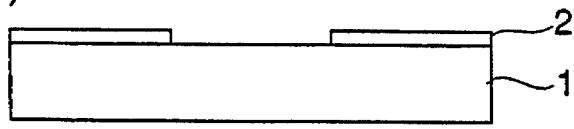
Figure 12:
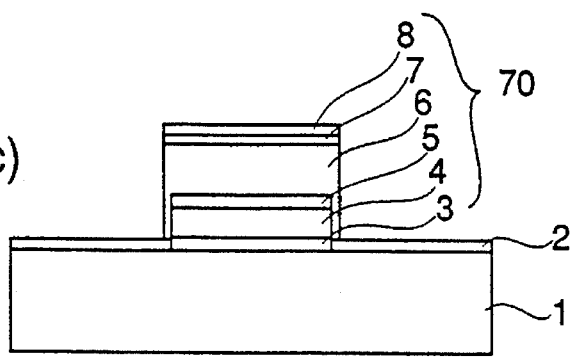
Figure 12:
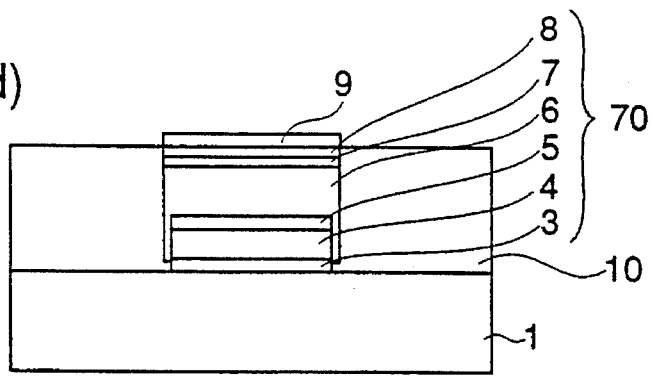
Figure 12:
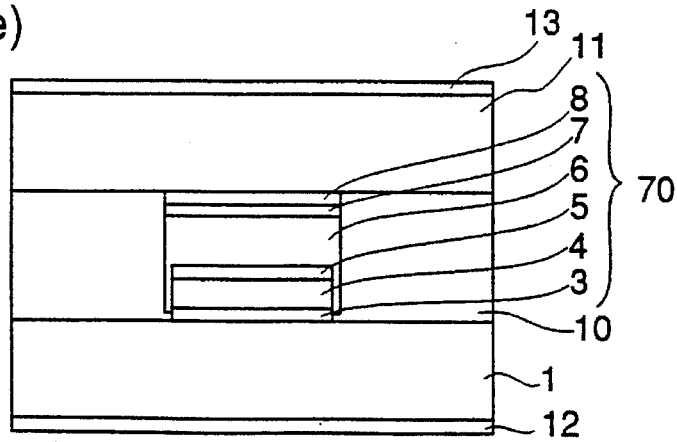

FIGS. 11(a) and 11(b) are sectional views illustrating process steps of growing a current blocking layer and a contact layer according to the third embodiment of the present invention. In the above-described first embodiment, the current blocking layer is grown on the both sides of the ridge to the same height of the ridge and, thereafter, the contact layer is grown on the ridge and on the current blocking layer. In this third embodiment of the invention, as shown in FIG. 11(a), after selective growth of a ridge having a double heterojunction structure, the ridge is completely buried with an AlGaInP current blocking layer 10, and a part of the current blocking layer 10 on the top of the ridge is selectively etched away to expose the p type GaAs cap layer 8. Thereafter, as illustrated in FIG. 11(b), a p type GaAs contact layer 71 is grown on the ridge and on the current blocking layer 10. When the current blocking layer 10 is etched, a selective etchant that does not etch the p type GaAs cap layer 8 is employed. Further, the current blocking layer 10 comprises a crystal having a high resistivity in its undoped state, such as i-GaInP, i-AlGaInP, i-GaAs, or i-AlGaAs, or a crystal having a resistivity increased by adding oxygen. Also in this case, the same effects as described in the first embodiment are obtained.

[Embodiment 4]

Figure 4:
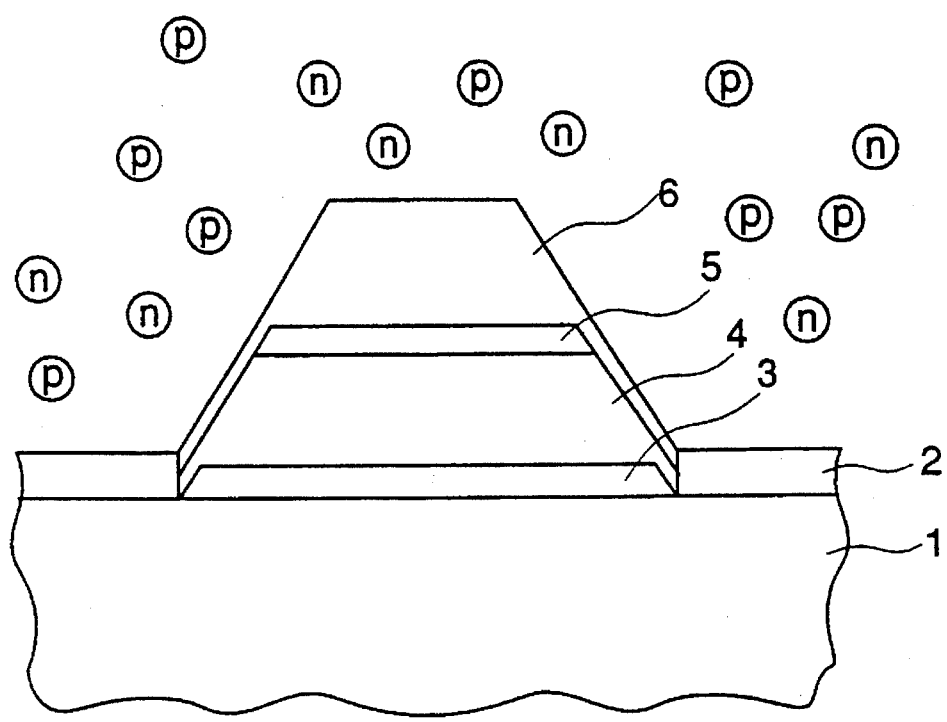
FIG. 4 is a sectional view for explaining simultaneous doping of p type and n type dopants in a ridge formation process according to the first embodiment of the present invention.
Figure 5:
FIGS. 5(a)–5(e) are sectional views illustrating a method of fabricating a semiconductor laser in accordance with a fifth embodiment of the present invention.
Figure 5:
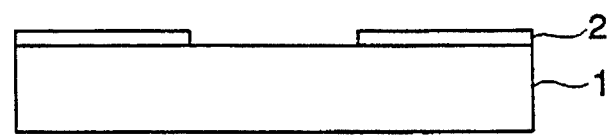
Figure 5:
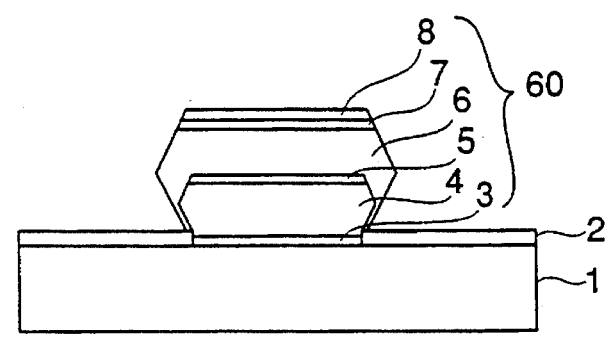
Figure 5:
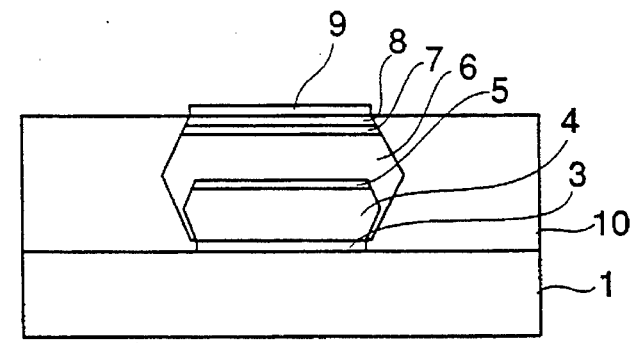
Figure 5:
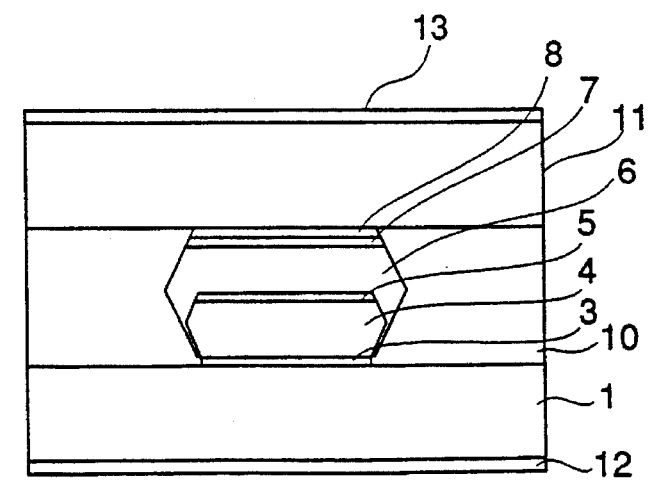

FIG. 4 is a sectional view illustrating a process step in a method of fabricating a semiconductor laser in accordance with a fourth embodiment of the present invention. In the figure, the same reference numerals as in FIGS. 1(a)–1(e) designate the same or corresponding parts.

In this fourth embodiment of the invention, in the selective growth of the ridge 50, the p type AlGaInP cladding layer 6 is grown while supplying a p type dopant source, such as DEZn and an n type dopant source, such as $H_2Se$, $SiH_4$, or $Si_2H_6$, as shown in FIG. 4. Generally, when a selective crystal growth is carried out on a (100) GaAs substrate while supplying a p type dopant source and an n type dopant source at the same time, a semiconductor layer grown on the flat (100) surface tends to be p type, and portions of the semiconductor layer grown at the side surfaces of the ridge inclined from the (100) surface tend to be n type. In this case, as the angle of the inclined surface increases, the tendency toward n type increases. In FIG. 4, when the ridge is selectively grown, inclined surfaces, such as a (11$\bar{1}$)B surface, are formed. Therefore, by supplying a dopant gas mixture with an appropriately selected ratio when the p type AlGaInP cladding layer 6 is grown, the p type dopant and the n type dopant are applied to the (11$\bar{1}$)B surface of the p type AlGaInP cladding layer 6, whereby the resistivity of the cladding layer 6 at the (11$\bar{1}$)B surface is increased. As a result, current flowing along the inclined surfaces of the ridge 50 is reduced, thereby increasing the current injection efficiency into the active layer 5.

According to the fourth embodiment of the present invention, reactive current flowing along the inclined surfaces of the ridge is reduced to increase the current injection efficiency into the active layer. Therefore, a low-threshold and high-output semiconductor laser with improved characteristics is realized.

While in the above-described fourth embodiment emphasis has been placed upon a laser structure including an n type substrate 1, a similar structure including a p type substrate is within the scope of the invention. In this case, when a p type AlGaInP lower cladding layer is grown in place of the n type AlGaInP cladding layer 4 of the fourth embodiment, dopant source gases with an appropriately selected ratio are is supplied to increase the resistivity at the inclined side surfaces of the p type AlGaInP lower cladding layer, whereby the same effects as described in the fourth embodiment are achieved.

[Embodiment 5]

FIGS. 5(a)–5(e) are sectional views illustrating a method of fabricating a semiconductor laser in accordance with a fifth embodiment of the present invention, taken along a plane parallel to a (0$\bar{1}$1) plane. In the figures, the same reference numerals as in FIGS. 1(a)–1(e) designate the same or corresponding parts. Reference numeral 60 designates a ridge. FIGS. 6(a)–6(e) are perspective views illustrating the method of fabricating a semiconductor laser according to the fifth embodiment of the invention, in which the same reference numerals as in FIGS. 5(a)–5(e) designate the same or corresponding parts.

While in the above-described first embodiment a stripe-shaped opening extending in the [011] direction is formed in the insulating film on the substrate 1 and the ridge 50 comprising a double heterojunction structure is selectively grown on the substrate exposed in the opening, in this fifth embodiment of the invention the stripe-shaped opening of the insulating film is formed in the [0$\bar{1}$1] direction.

The method of fabricating a semiconductor laser according to the fifth embodiment of the invention will be described using FIGS. 5(a)–5(e) and 6(a)–6(e).

Figure 6:
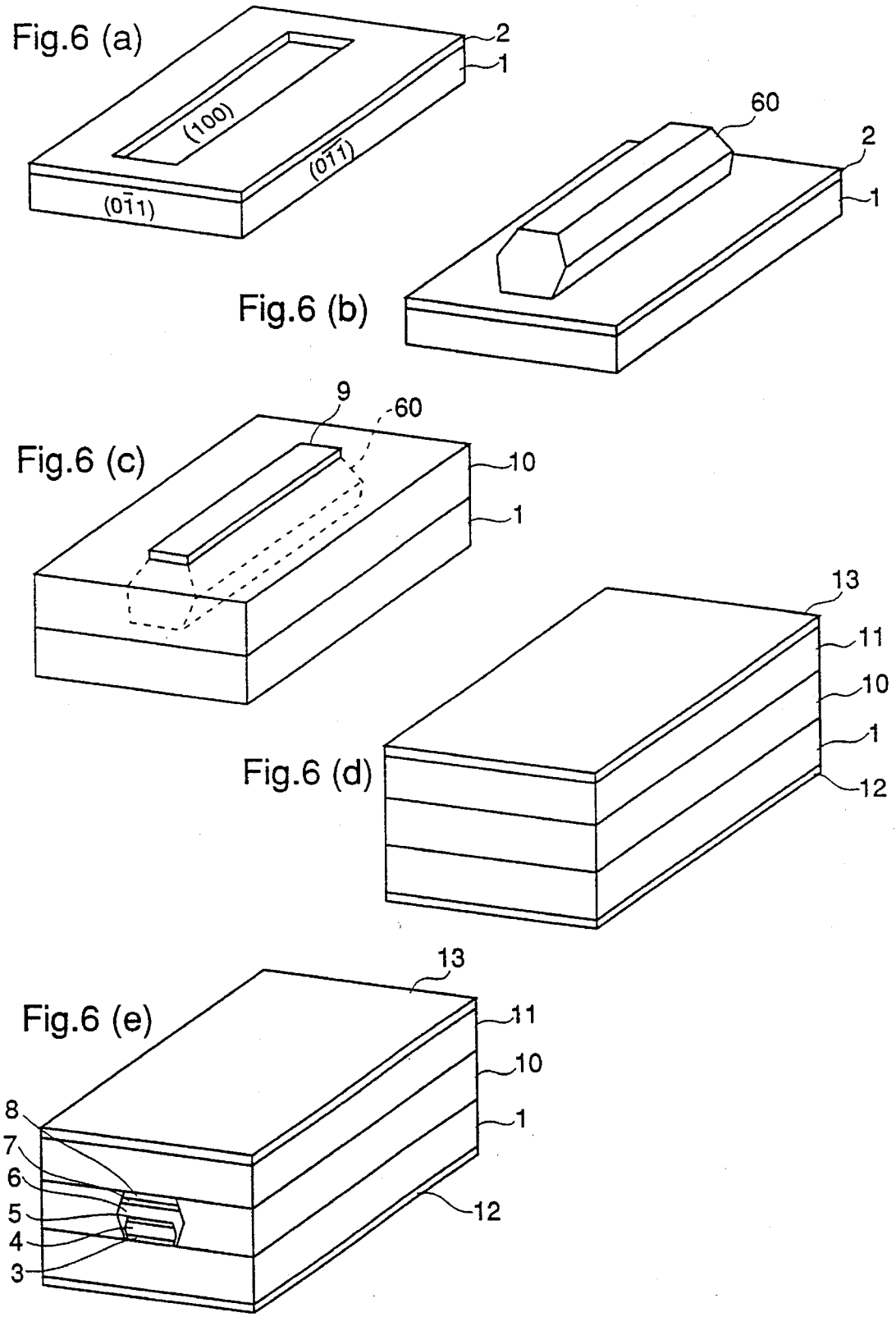
FIGS. 6(a)–6(e) are perspective views illustrating a method of fabricating a semiconductor laser in accordance with the fifth embodiment of the present invention.

Initially, an insulating film, such as SiN or SiO, is formed on a (100) surface of an n type GaAs substrate 1 shown in FIG. 1(a) and patterned to form a stripe-shaped opening in the [011] direction using a photolithographic technique, resulting in a first selective mask 2 (FIG. 5(b) and 6(a)). Thereafter, using the first selective mask 2, an n type GaAs buffer layer 3, an n type AlGaInP cladding Layer 4, a GaInP active layer 5, a p type AlGaInP cladding layer 6, a BDR layer 7, and a p type GaAs cap layer 8 are successively grown (FIGS. 5(c) and 6(b)).

As described in Crystal Growth 73 (1985), pp.73–76, when a stripe-shaped opening extending in the <0$\bar{1}$1> direction is formed in an SiN film on a {100} oriented GaAs substrate and AlGaAs is grown on the (100) surface exposed in the opening, a ridge having an isosceles trapezoidal cross-section in the stripe direction and a symmetrical hexagonal cross-section having opposite triangular edges in the direction perpendicular to the stripe is produced. One of the ends of the stripe-shaped ridge in the direction perpendicular to the stripe has an upper portion in a {111}A plane and a lower portion in a {$\bar{1}$11}B plane. In addition, one of the ends of the stripe-shaped ridge in the stripe direction is in a {11$\bar{1}$}B plane. Therefore, also in this fifth embodiment of the invention, as illustrated in FIG. 6(b), the n type GaAs buffer layer 3, the n type AlGaInP cladding layer 4, the GaInP active layer 5, the p type AlGaInP cladding layer 6, the BDR layer 7, and the p type GaAs cap layer 8 are successively grown covering the surface of the lower layer, resulting in a stripe-shaped ridge 60 having an isosceles trapezoidal cross-section in the stripe direction and a symmetrical hexagonal cross-section having opposite triangular edges in the direction perpendicular to the stripe. The growth rate on the {111}A plane or the {$\bar{1}$11}B plane is considerably lower than the growth rate on the flat {100} surface. Therefore, the thicknesses of the respective layers included in the ridge 60 are much thinner on the {111}A and {$\bar{1}$11}B planes at the side surface of the ridge than on the surface parallel to the flat (100) surface. The cross section of the ridge 60 is shown in FIG. 5(c). As shown in FIG. 5(c), the both ends of the active layer 5 in the direction perpendicular to the stripe direction are covered with the cladding layer 6, and the active layer 5 is completely embedded in the stripe-shaped ridge 60.

After removal of the insulating film 2, a second selective growth mask 9 is formed on the top of the ridge 60 and a current blocking layer 10 is grown on the substrate 1, contacting the opposite sides of the ridge 60 (FIGS. 5(d) and 6(c)). After removal of the selective growth mask 9, a p type GaAs contact layer 11 is grown on the ridge 60 and on the current blocking layer 10, and an n side electrode 12 and a p side electrode 13 are formed on the rear surface of the substrate 1 and the surface of the contact layer 11, respectively (FIGS. 5(e) and 6(d)). Finally, the structure is cleaved at positions where the active layer is present to complete a semiconductor laser diode (FIG. 6(e)).

Also in this fifth embodiment of the invention, since the crystal growth rate on the {111}A or {$\bar{1}$11}B plane is very small, portions of the active layer 5 grown on the side surfaces of the cladding layer 4 are very thin, and laser light is hardly produced in these portions of the active layer 5. In order to make the thickness of the active layer on the side surface of the ridge as thin as possible, the active layer should be grown under conditions that facilitate migration, as described in the first embodiment. Further, since the active layer 5 and the p type AlGaInP cladding layer 6 grown on the opposite side surfaces of the cladding layer 4 in the ridge 60 are sufficiently thin and sufficiently high in resistance, reactive current flowing toward the side surfaces of the n type AlGaInP cladding layer 4 is blocked by the high-resistance active layer 5 and the high-resistance p type AlGaInP cladding layer 6. Further, as described in the fourth embodiment, when a p type dopant source and an n type dopant source with an appropriately selected ratio are supplied during the growth of the cladding layer, the resistivity at the side surfaces of the ridge is surely increased.

Also in this fifth embodiment of the invention, since the stripe-shaped ridge 60 extending in the [0$\bar{1}$1] direction is formed by selectively growing the n type cladding layer 3, the active layer 5, and the p type cladding layer 6 using the first selective growth mask having a stripe-shaped opening extending in the [0$\bar{1}$1] direction, the ridge is easily produced with high processing precision with no etching process. As a result, a low-threshold and high-power semiconductor laser with suppressed spreading of current in the transverse direction.

[Embodiment 6]

FIGS. 12(a)–12(e) are sectional views illustrating process steps in a method of fabricating a semiconductor laser according to a sixth embodiment of the present invention, taken along a plane parallel to a (001) plane. In these figures, the same reference numerals as in FIGS. 1(a)–1(e) designate the same or corresponding parts. Reference numeral 70 designates a ridge. FIGS. 13(a)–13(e) are perspective views illustrating the process steps in the method according to the sixth embodiment. In these figures, the same reference numerals as in FIGS. 12(a)–12(e) designate the same or corresponding parts.

While in the above-described first embodiment a stripe-shaped opening extending in the [011] direction is formed in the insulating film on the substrate and a ridge having a double heterojunction is selectively grown on the substrate exposed in the opening, in this sixth embodiment the stripe-shaped opening of the insulating film is formed in the [001] direction.

A description is given of the fabrication process.

Initially, an insulating film, such as SiN or SiO, is formed on a (100) oriented n type GaAs substrate 1 shown in FIG. 12(a), and the insulating film is patterned to form a stripe-shaped opening in the [001] direction using a photolithographic technique, resulting in a selective growth mask 2 (FIGS. 12(b) and 13(a)).

In the step of FIG. 12(c), using the selective growth mask 2, an n type GaAs buffer layer 3, an n type AlGaInP cladding layer 4, a GaInP active layer 5, a p type AlGaInP cladding layer 6, a BDR layer 7, and a p type GaAs cap layer 8 are successively grown by MOCVD.

In the MOCVD process, as shown in FIG. 13(b), the buffer layer 3, the n type cladding layer 4, the active layer 5, the p type cladding layer 6, the BDR layer 7, and the cap layer 8 are successively grown covering the surface of the lower layer, whereby a rectangular-parallelopiped stripe ridge 70 is produced. The growth rate on a surface in a {010} plane is much lower than the growth rate on a flat {100} surface. Therefore, the thicknesses of the respective layers included in the ridge 70 are much thinner on the opposite sides of the stripe-shaped ridge than on the flat surface parallel to the (100) surface. The cross section of the ridge 70 is shown in FIG. 12(c). As shown in FIG. 12(c), both ends of the active layer 5 in the direction perpendicular to the stripe direction are covered with the cladding layer 6, and the active layer 5 is completely embedded in the ridge 70.

After removal of the insulating film 2, an insulating mask 9 is formed on the top of the ridge 70. Using this mask 9, a current blocking layer 10 is grown on the substrate 1, contacting the opposite sides of the ridge (FIGS. 12(d) and 13(c)). After removal of the insulating mask 9, a p type GaAs contact layer 11 is grown on the ridge 70 and on the current blocking layer 10, followed by formation of an n side electrode 12 on the rear surface of the substrate 1 and formation of a p side electrode 13 on the contact layer 11 (FIGS. 12(e) and 13(d)). Finally, the structure is cleaved at positions where the active layer is present to complete a semiconductor laser diode (FIG. 13(e)).

Also in this sixth embodiment of the invention, since portions of the active layer 5 grown on the both sides of the n type cladding layer 4 in the ridge 70 are very thin, laser light is hardly produced in these portions of the active layer. In order to make the active layer on the side surface of the ridge as thin as possible, the active layer should be grown under conditions that facilitate migration, as described in the first embodiment. Further, since the active layer 5 and the p type AlGaInP cladding layer 6 grown on the side surfaces of the cladding layer 4 are thin and high in resistance, reactive current flowing toward the side surfaces of the n type AlGaInP cladding layer 4 is blocked by the high-resistance active layer 5 and the high-resistance p type AlGaInP cladding layer 6. Further, as described in the fourth embodiment, when a p type dopant source and an n type dopant source with an appropriately selected ratio are supplied during the growth of the cladding layer 6, the resistivity at the side surfaces of the ridge is surely increased.

Also in this sixth embodiment of the invention, the stripe-shaped ridge 70 extending in the [001] direction is formed by selectively growing the n type cladding layer 4, the active layer 5, and the p type cladding layer 6 on the substrate 1 using the insulating mask having a stripe-shaped opening in the [001] direction. Therefore, as in the above-described first embodiment, the ridge is easily produced with high processing precision with no etching process, resulting in a low-threshold and high-power semiconductor laser with suppressed spreading of current in the transverse direction.

Although in the above-described sixth embodiment the stripe-shaped opening of the insulating film 2 is oriented in the [001] direction, it may be oriented in the [010] direction because a rectangular-parallelopiped ridge is produced also in this case with the same effects as described above.

[Embodiment 7]

Figure 14:
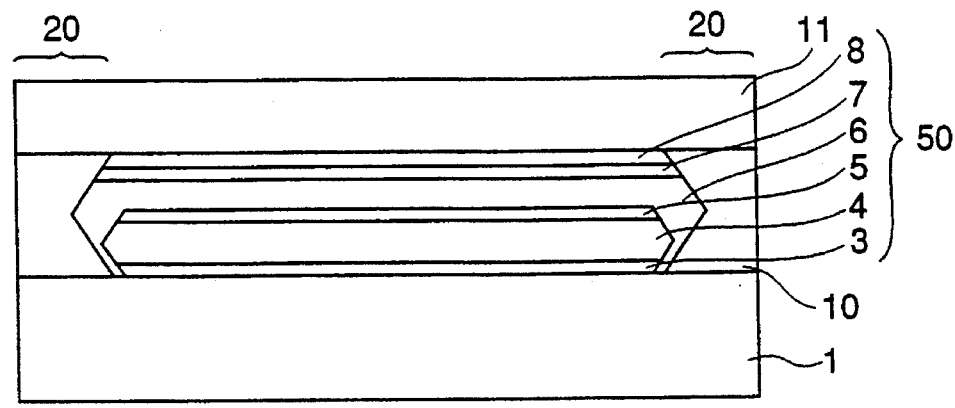
FIG. 14 is a sectional view of a semiconductor laser in the resonator length direction in accordance with a seventh embodiment of the present invention.

FIG. 14 is a sectional view illustrating a semiconductor laser in accordance with a seventh embodiment of the present invention. In the figure, the same reference numerals as in FIG. 14 designate the same or corresponding parts. Reference numeral 20 designates window structures.

In the above-described first embodiment, cleaving to form laser facets is performed at positions where the active layer is present. In this seventh embodiment of the invention, however, the length of the ridge is previously adjusted to the resonator length of the laser, and cleaving or dry etching to form the laser facets is performed at positions where the active layer is absent, i.e., positions at prescribed distances from the ends of the active layer in the stripe direction.

Sectional view of the laser structure in the resonator length direction after the above-described cleaving is shown in FIG. 14. In FIG. 14, the ends of the active layer 5 in the resonator length direction are covered with the p type AlGaInP cladding layer 6, and the resonator facets of the laser are covered with the current blocking layer 10. Since the band gap energies of the p type AlGaInP cladding layer 7 and the high-resistance AlGaInP current blocking layer 10 are larger than the band gap energy of the GaInP active layer 5, window structures 20 that hardly absorb laser light are formed in the vicinity of the resonator facets. Therefore, the laser facets are not easily destroyed even in high power operation of the laser.

Also in this seventh embodiment of the invention, the same effects as described in the first embodiment are obtained. In addition, since the cleaving is carried out at positions where the active layer 5 is absent, a high-power semiconductor laser having window structures is easily produced.

[Embodiment 8]

Figure 15:
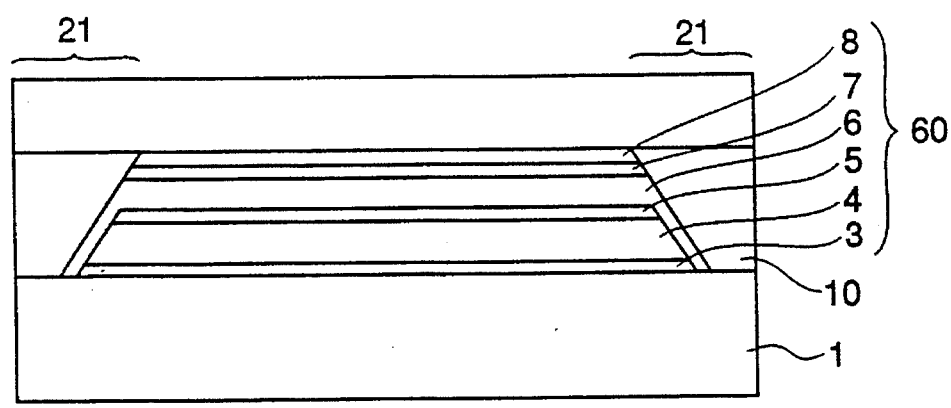
FIG. 15 is a sectional view of a semiconductor laser in the resonator length direction in accordance with an eighth embodiment of the present invention.

FIG. 15 is a sectional view illustrating a semiconductor laser in accordance with an eighth embodiment of the present invention. In the figure, the same reference numerals as in FIG. 5 designate the same or corresponding parts. Reference numeral 21 designates window structures.

In the above-described fifth embodiment, cleaving to form laser facets is performed at positions where the active layer is present. In this eighth embodiment of the invention, however, the length of the ridge is previously adjusted to the resonator length of the laser, and cleaving or dry etching to form laser facets is performed at positions where the active layer is absent, i.e., positions at prescribed distances from the ends of the active layer in the stripe direction.

The sectional view of the laser structure in the resonator length direction after the above-described cleaving is shown in FIG. 15. In FIG. 15, the opposite ends of the active layer 5 in the resonator length direction are covered with the p type AlGaInP cladding layer 6 and the resonator facets of the laser are covered with the current blocking layer 10. Since the band gap energies of the p type AlGaInP cladding layer 7 and the high-resistance AlGaInP current blocking layer 10 are larger than the band gap energy of the GaInP active layer 5, window structures 21 that hardly absorb laser light are formed in the vicinity of the resonator facets. Therefore, the laser facets are not easily destroyed even in high power operation of the laser.

Also in this eighth embodiment of the invention, the same effects as described in the fifth embodiment are obtained. In addition, since the cleaving is carried out at positions where the active layer 5 is absent, a high-power semiconductor laser having window structures is easily produced.

[Embodiment 9]

Figure 16:
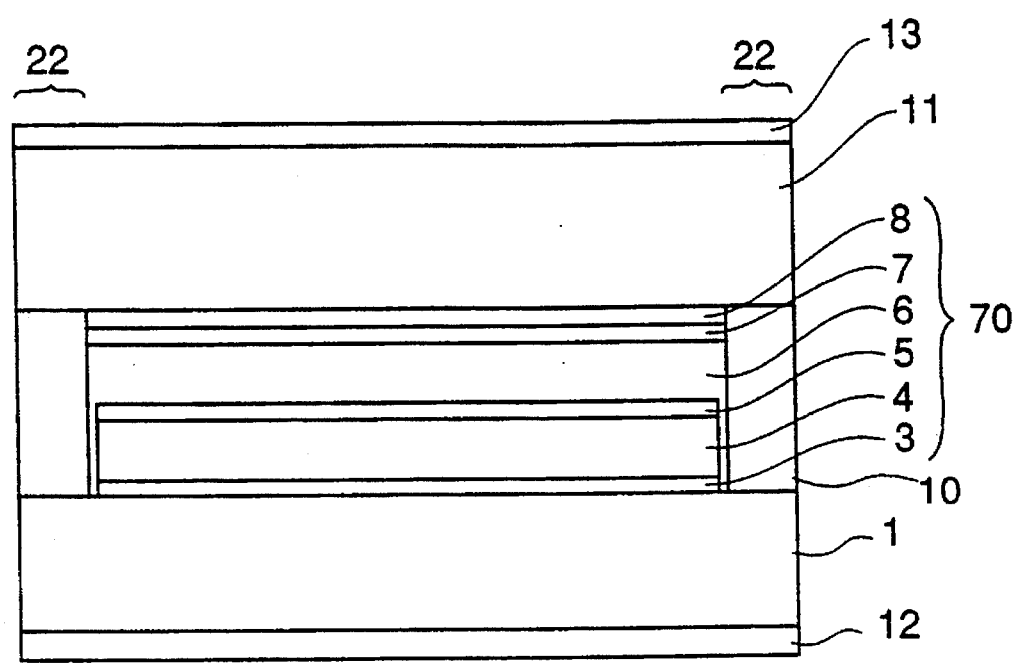
FIG. 16 is a sectional view of a semiconductor laser in the resonator length direction in accordance with a ninth embodiment of the present invention.

FIG. 16 is a sectional view illustrating a semiconductor laser in accordance with a ninth embodiment of the present invention. In FIG. 16, the same reference numerals as in FIG. 12 designate the same or corresponding parts. Reference numeral 22 designates window structures.

In the above-described sixth embodiment, cleaving to form laser facets is performed at positions where the active layer is present. In this ninth embodiment of the invention, however, the length of the ridge is previously adjusted to the resonator length of the laser, and cleaving or dry etching to form laser facets is performed at positions where the active layer is absent, i.e., positions at prescribed distances from the opposite ends of the active layer in the stripe direction.

The sectional view of the laser structure in the resonator length direction after the above-described cleaving is shown in 16. In FIG. 16, the opposite ends of the active layer 5 in the resonator length direction are covered with the p type AlGaInP cladding layer 6 and the resonator facets of the laser are covered with the current blocking layer 10. Since the band gap energies of the p type AlGaInP cladding layer 7 and the high-resistance AlGaInP current blocking layer 10 are larger than the band gap energy of the GaInP active layer 5, window structures 22 that hardly absorb laser light are formed in the vicinity of the resonator facets. Therefore, the laser facets are not easily destroyed even in high power operation of the laser.

Also in this ninth embodiment of the invention, the same effects as described in the sixth embodiment are obtained. In addition, since the cleaving is carried out at positions where the active layer 5 is absent, a high-power semiconductor laser having window structures is easily produced.

While in the above-described seventh to ninth embodiments high-resistance AlGaInP is employed for the current blocking layer 10, other materials may be employed so long as it has a band gap energy larger than the band gap energy of the active layer and has characteristics applicable to the current blocking layer. [Embodiment 10]

Figure 17:
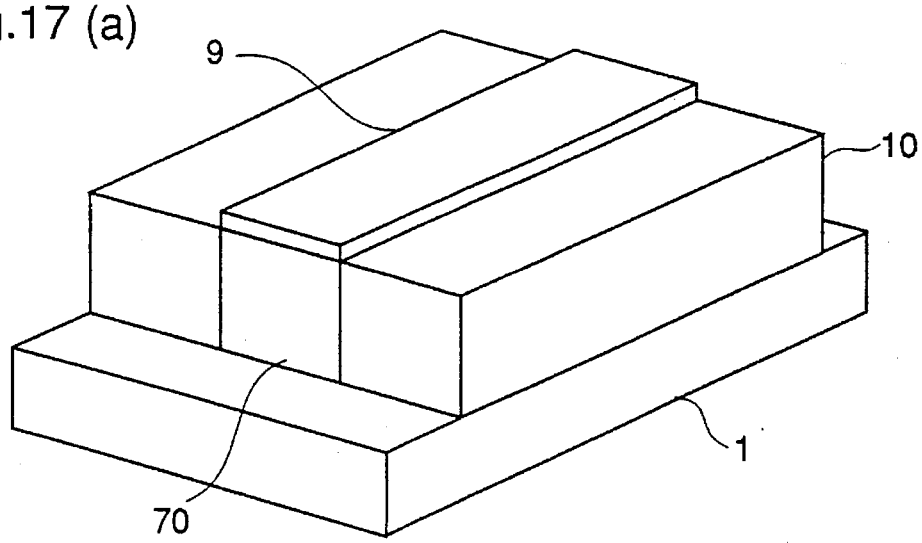
FIGS. 17(a) and 17(b) are perspective views illustrating major process steps in a method of fabricating a semiconductor laser in accordance with a tenth embodiment of the present invention.
FIG. 17(c) is a sectional view taken along a line 17c–17c of FIG. 17(b).
Figure 17:
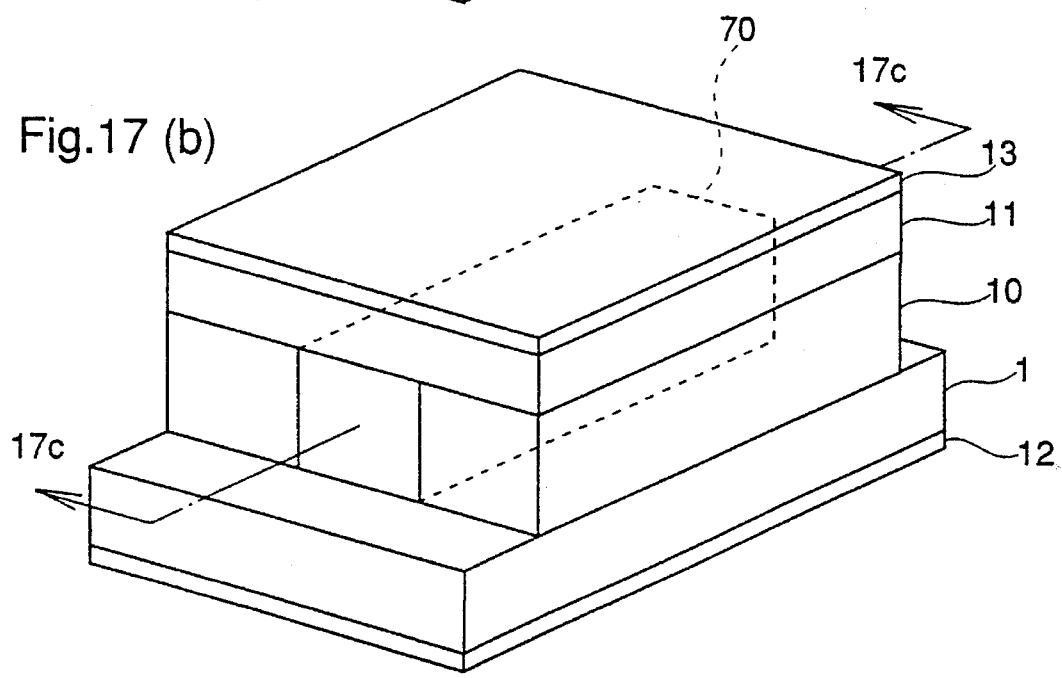
Figure 17:
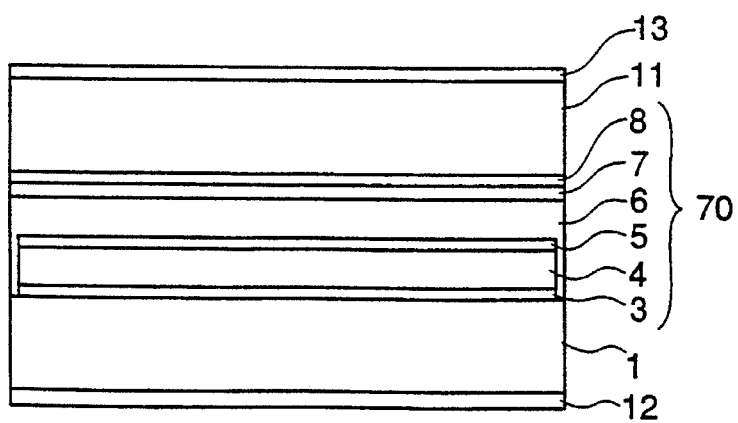
Figure 18:
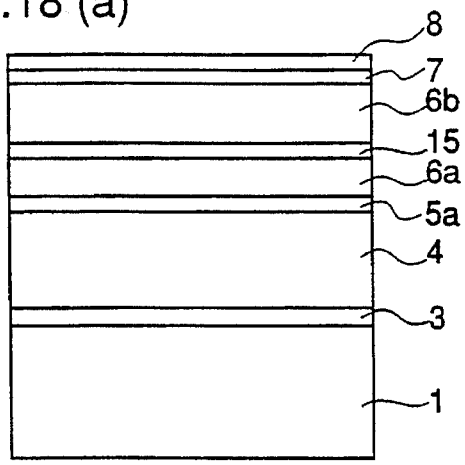
Figure 18:
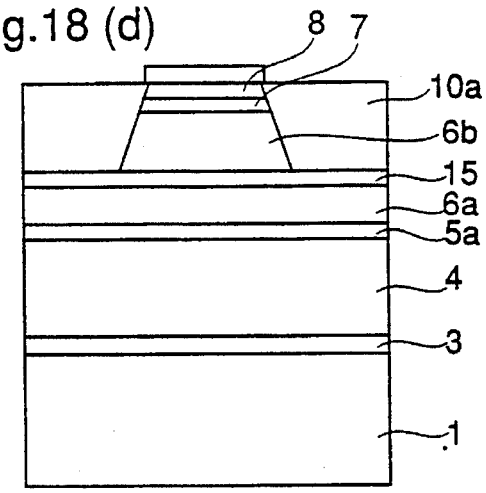
Figure 18:
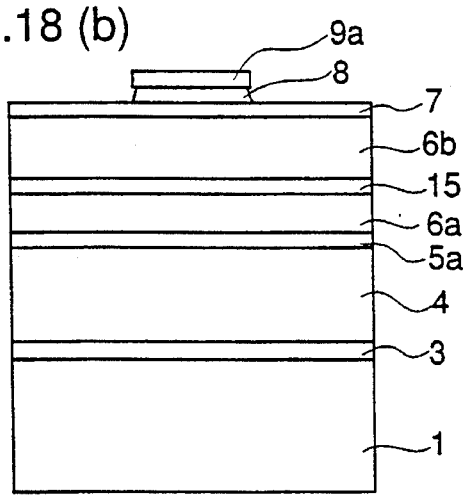
Figure 18:
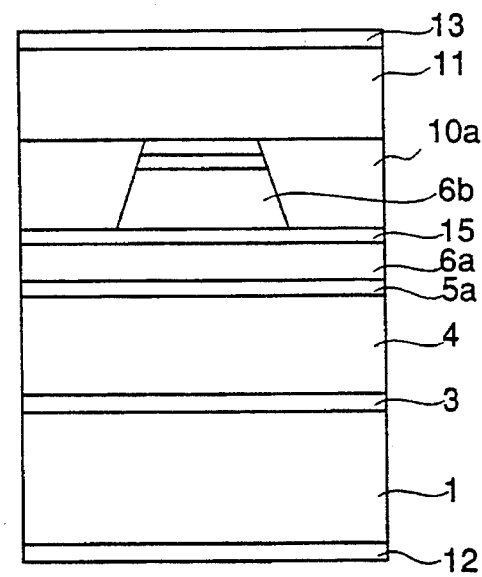
Figure 18:
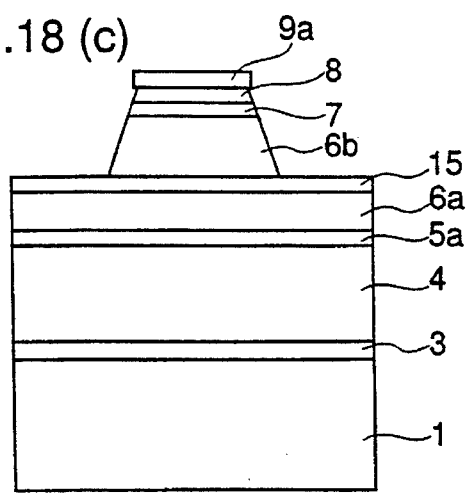

FIGS. 17(a)–17(c) illustrate process steps in a method of fabricating a semiconductor laser in accordance with a tenth embodiment of the present invention, in which FIGS. 17(a) and 17(b) are perspective views and FIG. 17(c) is a sectional view taken along a line 17c–17c of FIG. 17(b). In these figures, the same reference numerals as in FIGS. 12(a)–12(e) designate the same or corresponding parts.

In the above-described ninth embodiment, the opposite ends of the ridge in the resonator length direction are covered with the current blocking layer 10, forming the window structures 22. In this tenth embodiment of the invention, however, a stripe-shaped ridge 70 is formed so that the stripe length is equal to the resonator length of the laser, and a current blocking layer 10 is grown contacting the opposite sides of the ridge 70 using a selective growth mask 9 as shown in FIG. 17(a). The facets of the ridge 70 in the stripe direction are not covered with the current blocking layer 10. Thereafter, as shown in FIG. 17(b), the insulating mask 9 is removed and the contact layer 11, the n side electrode 12, and a p side electrode 13 are formed to complete the semiconductor laser.

In the semiconductor laser fabricated as described above, since the facets of the stripe-shaped ridge 70 selectively grown in the [001] or [010] direction are perpendicular to the resonator length direction, these facets can be used as laser facets. In other words, the laser facets can be formed without cleaving. Further, since the opposite ends of the active layer in the resonator length direction are covered with the p type AlGaInP cladding layer having a band gap energy larger than the band gap energy of the active layer 5, these portions serve as window structures.

As described above, according to the tenth embodiment of the invention, a semiconductor laser with window structures can be easily produced without cleaving.

Although in the above-described first to tenth embodiments GaInP is employed as a material of the active layer, other materials, for example, $Al_xGa_{1-x}InP$ ($0 \leq x \leq 1$), may be employed.

Although in the first to tenth embodiments of the r invention a laser structure including an active layer comprising a single layer of GaInP is described, the present invention may be applied to a laser structure including an active layer having a multiquantum well (MQW) structure, a double quantum well (DQW) structure, or a single quantum well (SQW) structure. Further, a laser structure including a separate confinement heterostructure (SCH) in the vicinity of an active layer and a laser structure including an active layer combined with a multiquantum barrier (MQB) structure are within the scope of the invention. Furthermore, a strain may be incorporated in the MQW active layer or the superlattice structure, such as the MQB structure. Also in these cases, the same effects as described in the first embodiment are obtained.

In the foregoing description, emphasis has been placed upon a visible light semiconductor laser comprising AlGaInP series material and using an n type GaAs substrate. However, a similar laser structure comprising AlGaAs series materials producing short wavelength light or InP series materials producing long wavelength light is within the scope of the invention.

Furthermore, the present invention may be applied to a semiconductor laser having elements with conductivity types opposite the conductivity types of corresponding elements of the semiconductor lasers described according to. In this case, when a dopant impurity is diffused into a part of the current blocking layer opposite the ridge to make a contact with the ridge as shown in FIG. 9, the contact layer comprises n type GaAs or n type Ge, and an n type dopant, such as Se or Si, is employed in place of Zn.

In the foregoing description, emphasis has been placed upon a laser structure in which a semiconductor substrate has a (100) oriented surface and a stripe-shaped ridge extends in a [011], [01$\bar{1}$], [001], or [010] direction, However, the present invention may be applied to a laser structure in which a semiconductor substrate has a surface in a plane equivalent to the (100) plane, i.e., {100} plane, and a stripe-shaped ridge extends in a <011>, <01$\bar{1}$>, <001>, or <010> direction. Also in this case, the same effects as described in the respective embodiments of the invention are obtained.

Furthermore, in the foregoing description emphasis has been placed upon a laser structure in which a stripe-shaped ridge is formed on a {100} surface of a semiconductor substrate. However, the present invention may be applied to a similar structure in which a stripe-shaped ridge is formed on a surface inclined from the {100} surface. In this case, although the shape of the stripe-shaped ridge varies according to the degree of the inclination, the same effects as described above are obtained.

What is claimed is:

1. A semiconductor laser structure including:
   a semiconductor substrate having a first conductivity type and a {100} oriented surface; and
   a double-heterojunction structure comprising a first conductivity type lower cladding layer having a {100} oriented surface and disposed on the {100} surface of the substrate, an active layer having a band gap energy and disposed on the {100} surface of the first conductivity type lower cladding layer, and an upper cladding layer having a second conductivity type, opposite the first conductivity type, and covering opposite side surfaces of the active layer and the first conductivity type lower cladding layer, wherein the double-heterojunction structure is a stripe-shaped ridge extending in a <011> direction and having a mesa-shaped cross-section in a direction perpendicular to the stripe direction.

2. The semiconductor laser structure of claim 1 wherein said first conductivity type substrate comprises GaAs, the first conductivity type cladding layer comprises AlGaInP, the active layer comprises GaInP, and the second conductivity type cladding layer comprises AlGaInP.

3. The semiconductor laser structure of claim 1 wherein the second conductivity type upper cladding layer covers opposite side surfaces of the stripe-shaped ridge in the stripe direction, and the ridge is buried in a current blocking layer having a band gap energy larger than the band gap energy of the active layer.

4. The semiconductor laser structure of claim 3 wherein the current blocking layer comprises AlGaInP.

5. The semiconductor laser structure of claim 1 wherein portions of the upper cladding layer at the side surfaces of the ridge in the vicinity of the first conductivity type cladding layer have high resistivity.

6. A semiconductor laser structure including:
   a semiconductor substrate having a first conductivity type and a {100} oriented surface; and
   a double-heterojunction structure comprising a first conductivity type lower cladding layer having a {100} oriented surface and disposed on the {100} surface of the substrate, an active layer having a band gap energy and disposed on the {100} surface of the first conductivity type lower cladding layer, and an upper cladding layer having a second conductivity type, opposite the first conductivity type, and covering opposite side surfaces of the active layer and the first conductivity type lower cladding layer, wherein the double-heterojunction structure is a stripe-shaped ridge extending in a <0$\bar{1}$1> direction and having a symmetrical hexagonal cross-section in a direction perpendicular to the stripe direction.

7. The semiconductor laser structure of claim 6 wherein the first conductivity type substrate comprises GaAs, the first conductivity type cladding layer comprises AlGaInP, the active layer comprises GaInP, and the second conductivity type cladding layer comprises AlGaInP.

8. The semiconductor structure of claim 6 wherein the second conductivity type upper cladding layer covers opposite side surfaces of the stripe-shaped ridge in the stripe direction, and the ridge is buried in a current blocking layer having a band gap energy larger than the band gap energy of the active layer.

9. The semiconductor laser structure of claim 8 wherein the current blocking layer comprises AlGaInP.

10. The semiconductor laser structure of claim 6 wherein portions of the upper cladding layer at the side surfaces of the ridge in the vicinity of the first conductivity type cladding layer have high resistivity.

11. A semiconductor laser structure including:
    a semiconductor substrate having a first conductivity type and a {100} oriented surface; and
    a double heterojunction structure comprising a first conductivity type lower cladding layer having a {100} oriented surface and disposed on the {100} surface of the substrate, an active layer having a band gap energy and disposed on the {100} surface of the first conductivity type lower cladding layer, and an upper cladding layer having a second conductivity type, opposite surfaces of the active layer and the first conductivity type lower cladding layer, wherein the double-heterojunction structure is a stripe-shaped ridge extending in a >001> direction or a <010> direction and having a rectangular cross-section in a direction perpendicular to the stripe direction.

12. The semiconductor laser structure of claim 11 wherein the first conductivity type substrate comprises GaAs, the first conductivity type cladding layer comprises AlGaInP, the active layer comprises GaInP, and the second conductivity type cladding layer comprises AlGaInP.

13. The semiconductor laser structure of claim 11 wherein the second conductivity type upper cladding layer covers opposite side surfaces of the stripe-shaped ridge in the stripe direction, and the ridge is buried in a current blocking layer having a band gap energy larger than the band gap energy of the active layer.

14. The semiconductor laser structure of claim 13 wherein the current blocking layer comprises AlGaInP.

15. The semiconductor laser structure of claim 11 wherein portions of the upper cladding at the side surfaces of the ridge in the vicinity of the first conductivity type cladding layer have high resistivity.

16. The semiconductor laser structure of claim 11 wherein the opposite side surfaces of the ridge are resonator facets of the semiconductor laser, and the second conductivity type cladding layer covers the active layer and the first conductivity type cladding layer at the resonator facets of the semiconductor laser.

* * * * *

UNITED STATES PATENT AND TRADEMARK OFFICE
CERTIFICATE OF CORRECTION

PATENT NO. : 5,604,764
DATED : February 18, 1997
INVENTOR(S) : Motoda et al.

It is certified that error appears in the above-indentified patent and that said Letters Patent is hereby corrected as shown below:

Column 20, Line 54, change "A" to --In a--;

Line 57, after "double" insert -- - --;

Line 63, after "opposite" insert --the first conductivity type, and covering opposite side--;

Line 67, change ">001>" to --<001>--;

Column 22, Line 2, after "cladding" insert --layer--.

Signed and Sealed this

Sixth Day of May, 1997

Attest:

BRUCE LEHMAN

*Attesting Officer*     *Commissioner of Patents and Trademarks*